(12) United States Patent
Oh et al.

(10) Patent No.: US 11,282,899 B2
(45) Date of Patent: Mar. 22, 2022

(54) DISPLAY DEVICE WITH IMPROVED DISPLAY ON CURVED PORTION

(71) Applicant: Samsung Display Co., Ltd., Yongin-si (KR)

(72) Inventors: Eon Seok Oh, Seongnam-si (KR); Han-Na Ma, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/942,848

(22) Filed: Jul. 30, 2020

(65) Prior Publication Data

US 2020/0357865 A1  Nov. 12, 2020

Related U.S. Application Data

(62) Division of application No. 15/956,212, filed on Apr. 18, 2018, now Pat. No. 10,763,310.

(30) Foreign Application Priority Data

Sep. 7, 2017 (KP) .................. 10-2017-0114752

(51) Int. Cl.
*H01L 27/32* (2006.01)
*H01L 51/52* (2006.01)

(52) U.S. Cl.
CPC ........ *H01L 27/3218* (2013.01); *H01L 27/326* (2013.01); *H01L 27/3248* (2013.01); *H01L 27/3267* (2013.01); *H01L 51/524* (2013.01); *H01L 51/5209* (2013.01);

(Continued)

(58) Field of Classification Search
CPC .............. H01L 27/3218; H01L 51/524; H01L 2251/5323; H01L 33/483; H01L 2251/5315; H01L 2251/5338; H01L 27/3244

See application file for complete search history.

(56) References Cited

U.S. PATENT DOCUMENTS 9,271,395 B2 * 2/2016 Hongo ................. H05K 1/0283
9,454,930 B2 ‡ 9/2016 Oh ........................ H01L 27/326
9,525,012 B2 * 12/2016 Lim ..................... H01L 27/3244

(Continued)

FOREIGN PATENT DOCUMENTS

JP        2015103406      ‡  6/2015
JP        2015122248      ‡  7/2015

(Continued)

*Primary Examiner* — Tracie Y Green
(74) *Attorney, Agent, or Firm* — Cantor Colburn LLP

(57) ABSTRACT

A display device includes a cover window that includes a first plane portion and first side portions that form curved sides, and a display panel that includes a first plane area corresponding to the first plane portion and first curved areas corresponding to the first side portions, where the display panel further includes a substrate, a plurality of first type pixels that are disposed in the first plane area and each including a first light emitting diode that is parallel with one side of the substrate, and a plurality of second type pixels that are disposed in the first curved areas, and each including a second light emitting diode that includes at least one non-flat portion forming a non-flat side that is not parallel with one side of the substrate.

12 Claims, 22 Drawing Sheets

(52) U.S. Cl.
CPC .. *H01L 51/5225* (2013.01); *H01L 2251/5315* (2013.01); *H01L 2251/5323* (2013.01)

(56) References Cited

U.S. PATENT DOCUMENTS

| | | | |
|---|---|---|---|
| 10,224,502 B2* | 3/2019 | Cho | G06F 1/1626 |
| 2006/0072052 A1* | 4/2006 | Kim | G02F 1/133308 |
| | | | 349/60 |
| 2010/0293782 A1* | 11/2010 | Yamazaki | H01L 51/0097 |
| | | | 29/825 |
| 2014/0231763 A1* | 8/2014 | Kim | H01L 27/3218 |
| | | | 257/40 |
| 2014/0234581 A1* | 8/2014 | Immerman | C03B 23/0357 |
| | | | 428/141 |
| 2014/0312319 A1* | 10/2014 | Kim | H01L 27/3258 |
| | | | 257/40 |
| 2014/0335322 A1* | 11/2014 | Luo | C03B 23/0307 |
| | | | 428/177 |
| 2018/0314354 A1* | 11/2018 | Tang | G06F 1/1647 |

FOREIGN PATENT DOCUMENTS

| | | | |
|---|---|---|---|
| KR | 1020150010384 | ‡ | 1/2015 |
| KR | 1020150077279 | ‡ | 7/2015 |

\* cited by examiner
‡ imported from a related application

FIG. 10
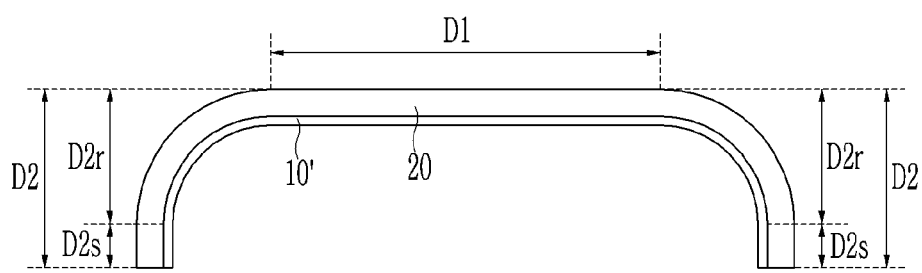
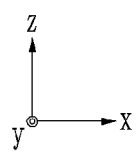

DISPLAY DEVICE WITH IMPROVED DISPLAY ON CURVED PORTION

This application is a divisional of U.S. patent application Ser. No. 15/956,212, filed on Apr. 18, 2018, which claims priority to Korean Patent Application No. 10-2017-0114752, filed on Sep. 7, 2017, and all the benefits accruing therefrom under 35 U.S.C. § 119, the content of which in its entirety is herein incorporated by reference.

BACKGROUND

(a) Field

Exemplary embodiments of the invention relate to a display device. More particularly, exemplary embodiments of the invention relate to a display device that includes a curved portion.

(b) Description of the Related Art

Recently, a display device including a plastic substrate which is light in weight, strong against impact, and flexible as a substrate of a display panel for the display device has been developed. The flexible display device may be folded or rolled in a portable form such that the flexible display device may be utilized in various fields.

The flexible display device includes a display element that is disposed on a flexible substrate. As the display element that may be included in the flexible display device, an organic light emitting display element, a liquid crystal display element, and the like may be included. Such display elements commonly include a thin film transistor ("TFT"). Accordingly, the flexible substrate undergoes several thin film processes. The flexible substrate having undergone the thin film processes is sealed by an encapsulation layer. The flexible substrate, the TFT provided in the flexible substrate, and the encapsulation layer form a display panel of the display device.

In general, a cover window that protects the display panel is attached to an entire surface of the display panel. In this case, an adhesive is provided between the display panel and the cover window such that the display panel and the cover window are bonded to each other.

SUMMARY

Recently, a display device in which an image may be displayed in a curved portion by bonding a display panel to a cover window having a side bent structure in which edge of a plane portion are curved has been developed.

When such a display device is viewed from the front, a color of an image displayed on the curved portion may be reddish or bluish such that a color failure may occur.

The invention has been made in an effort to solve such a color failure in an image displayed on the curved portions.

A display device according to an exemplary embodiment of the invention includes a cover window that includes a first plane portion and first side portions that form curved sides, and a display panel that includes a first plane area corresponding to the first plane portion and first curved areas corresponding to the first side portions, where the display panel further includes a substrate, a plurality of first type pixels that are disposed in the first plane area and each including a first light emitting diode that is parallel with one side of the substrate, and a plurality of second type pixels that are disposed in the first curved areas, and each including a second light emitting diode that includes at least one non-flat portion forming a non-flat side that is not parallel with one side of the substrate.

In an exemplary embodiment, a number of non-flat portions included in the second type pixel may be increased as a distance becomes greater from the first plane area.

In an exemplary embodiment, a distribution of the plurality of second type pixels may be gradually increased as a distance becomes greater from the first plane area.

In an exemplary embodiment, the second light emitting diode may include a pixel electrode to which a current corresponding to a data voltage is applied, an emission layer that is disposed on the pixel electrode, and a power source electrode that is disposed on the emission layer, and the pixel electrode, the emission layer, and the power source electrode may include concave patterns that overlap each other.

In an exemplary embodiment, the pixel electrode may be a reflective electrode, and the power source electrode may be a semi-transmissive electrode.

In an exemplary embodiment, the first side portions may be disposed at opposite ends of the first plane portion in a first direction, and the first curved areas may be disposed at opposite ends of the first plane area in the first direction.

In an exemplary embodiment, the first side portions may include curved portions extended from the first plane portion and second plane portions extended from the curved portions, the display panel may further include second plane areas corresponding to the second plane portions, and pixels of the same type as that of the first type pixels may be disposed in the second plane areas.

In an exemplary embodiment, the cover window may further include second side portions that are disposed at opposite ends of the first plane portion in a second direction and third side portions that form curved sides connecting the first side portions and the second side portions with each other, and the display panel may further include second curved areas corresponding to the second side portions and third curved areas corresponding to the third side portions.

In an exemplary embodiment, pixels of the same type as that of the plurality of second type pixels may be disposed in the second curved areas and the third curved areas.

In an exemplary embodiment, the plurality of second type pixels may include red pixels, green pixels, and blue pixels, and a number of non-flat portions included in one of the red pixel, the green pixel, and the blue pixel may be different from a number of non-flat portions included in a remaining of the red pixel, the green pixel, and the blue pixel.

In an exemplary embodiment, the display device may further include a rear cover window that includes a first rear plane portion and rear side portions forming curved sides, and a second display panel that includes a first rear plane area corresponding to the first rear plane portion and rear curved areas corresponding to the rear side portions, where the second display panel may include a rear substrate, pixels that are disposed in the first rear plane area and are the same type as that of the plurality of first type pixels, and pixels that are disposed in the rear curved areas and are the same type as that of the plurality of second type pixels.

A display device according to another exemplary embodiment of the invention includes a substrate that includes a first plane area and first curved areas forming curved sides, a plurality of first type pixels disposed in the first plane area, and a plurality of second type pixels disposed in the first curved areas, where each of the plurality of first type pixels may include a first light emitting diode provided in parallel with one side of the substrate, and each of the plurality of second type pixels may include a second light emitting diode that includes at least one non-flat portion forming a non-flat side that is not parallel with one side of the substrate.

In an exemplary embodiment, a distribution of the plurality of second type pixels may be gradually increased as a distance becomes greater from the first plane area.

In an exemplary embodiment, the first curved areas may include first sub-curved areas disposed closest to the first plane area and second sub-curved areas disposed farther away from the first plane area than the first sub-curved areas, the plurality of second type pixels may include first pixels, each including a predetermined number of non-flat portions, and second pixels, each including more non-flat portions than those of the first pixels, and the first pixels may be disposed in the first sub-curved area and the second pixels may be disposed in the second sub-curved area.

In an exemplary embodiment, the first pixel and the second pixel may respectively include red pixels, green pixels, and blue pixels, and a number of non-flat portions included in the red pixels may be different from a number of non-flat portions included in the green pixels or the blue pixels in at least one of the first sub-curved area and the second sub-curved area.

In an exemplary embodiment, the first curved areas may be disposed at opposite ends of the first plane area in a first direction.

In an exemplary embodiment, the substrate may further include second curved areas disposed at opposite ends of the first plane area in a second direction and forming curved sides, and third curved areas connecting the first curved areas and the second curved areas with each other, and pixels of the same type as that of the plurality of second type pixels may be disposed in at least one of the second curved area and the third curved area.

A display device according to another exemplary embodiment of the invention includes a first plane area viewed as a plane in a plan view; first curved areas viewed at a side viewing angle tilted at a predetermined angle with reference to the first plane area, a plurality of first type pixels disposed in the first plane area, and a plurality of second type pixels disposed in the first curved areas, where each of the plurality of first type pixels includes a first light emitting diode provided parallel with the plane, and each of the plurality of second type pixels includes a second light emitting diode that includes at least one non-flat portion forming a non-flat side that is not parallel with the plane.

In an exemplary embodiment, a distribution of the plurality of second type pixels may be gradually increased as the side viewing angle is increased.

In an exemplary embodiment, a number of non-flat portions included in the second type pixels may be increased as the side viewing angle is increased.

In an exemplary embodiment, the first curved areas may include first sub-curved areas viewed at a side viewing angle tilted to a first angle range with reference to the first plane area and second sub-curved areas viewed at a side viewing angle tilted to a second angle range that is greater than the first angle range with reference to the first plane area, and the number of non-flat portions included in the second type pixels disposed in the second sub-curved areas may be greater than the number of non-flat portions included in the second type pixels disposed in the first sub-curved areas.

In an exemplary embodiment, the plurality of second type pixels may include red pixels, green pixels, and blue pixels, and a number of non-flat portions included in the red pixels in the first sub-curved areas may be different from a number of non-flat portions included in the green pixels or the blue pixels in the first sub-curved areas.

In an exemplary embodiment, a number of non-flat portions included in the red pixels in the second sub-curved areas may be different from a number of non-flat portions included in the green pixels or the blue pixels in the second sub-curved areas.

In an exemplary embodiment, a color failure such as reddishness or bluishness of an image displayed on a curved portion of the display device may be solved.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIG. 10 shows a display device according to the invention.

DETAILED DESCRIPTION

Figure 1:
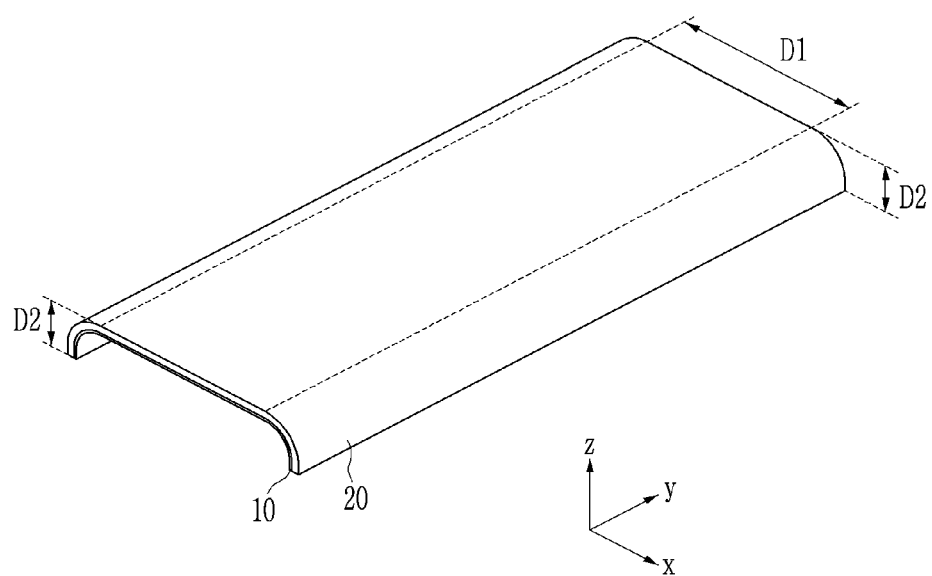
FIG. 1 shows an exemplary embodiment of a display device according to the invention.

Exemplary embodiments of the invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

Accordingly, the drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. It will be understood that when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements.

Also, throughout the specification, when something is referred to as being "overlapped", this means that it is overlapped on the cross-section, or all or part of the plane is located in the same area.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or."

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, a display device according to an exemplary embodiment of the invention will be described with reference to FIGS. 1 to 7.

Figure 2:
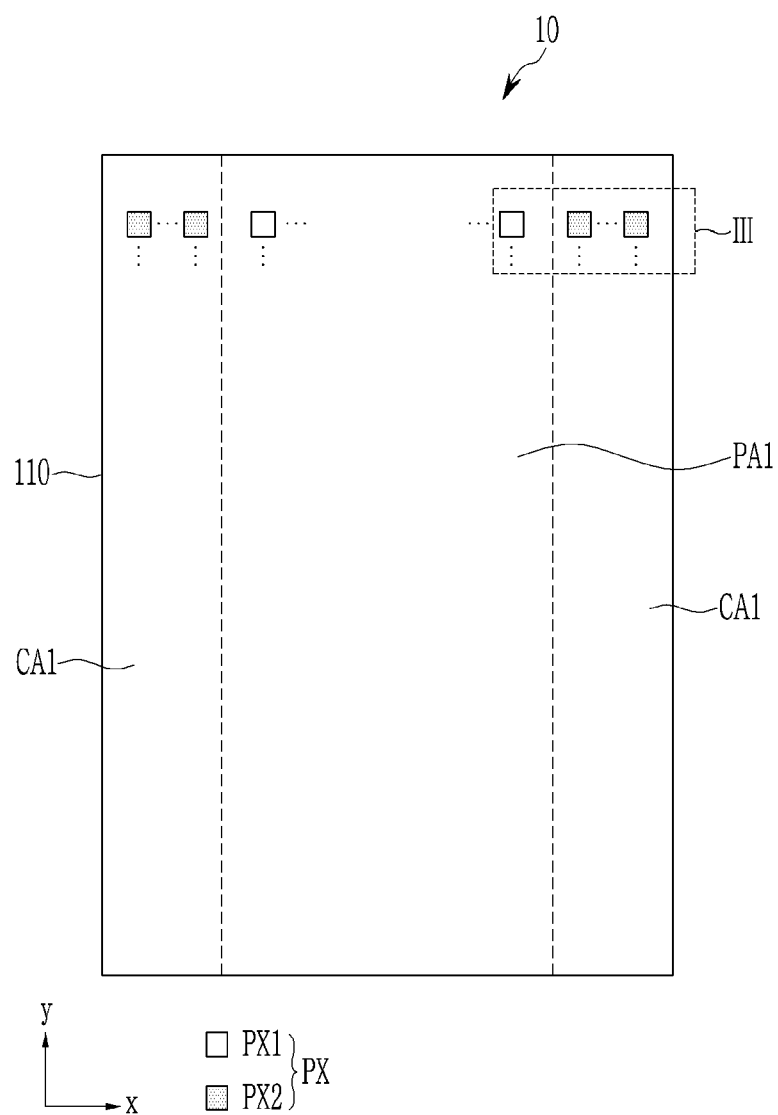
FIG. 2 illustrates a display panel included in the display device of FIG. 1.
Figure 3:
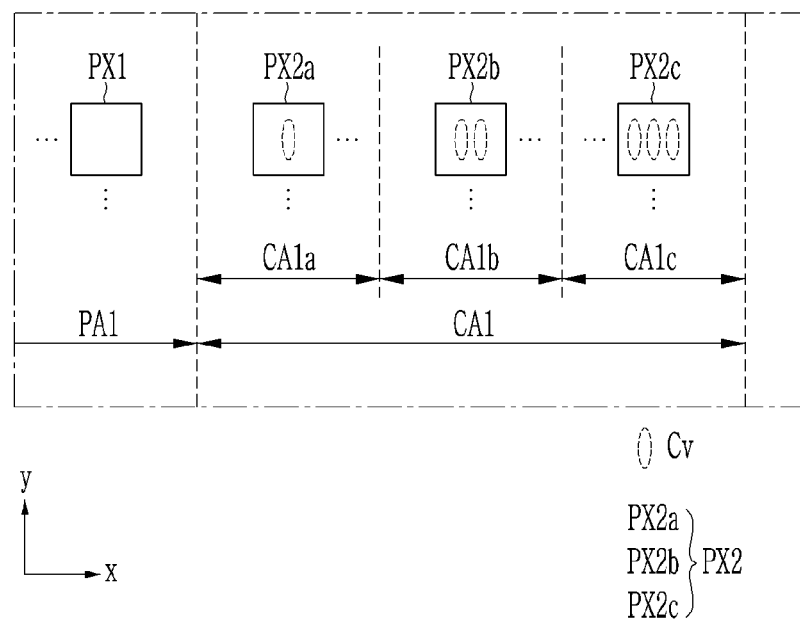
FIG. 3 illustrates area III of FIG. 2 in detail.

FIG. 1 shows a display device according to an exemplary embodiment of the invention. FIG. 2 shows a display panel included in the display device of FIG. 1. FIG. 3 shows area III of FIG. 2 in detail.

Referring to FIG. 1, a display device according to an exemplary embodiment includes a display panel 10 where an image is displayed, and a cover window 20 that protects the display panel 10. The display panel 10 may be bonded to a rear side of the cover window 20 depending on a shape of the cover window 20.

The display panel 10 may include a touch sensor (not shown), and may be flexible. A printed circuit board (not shown), a battery (not shown) of the display device, and the like may be provided inside the display panel 10, that is, at a lower portion of the display panel 10.

The cover window 20 has a side bent structure of which at least one of first side portions D2 is bent, and the display panel 10 is bonded to a rear side of the cover window 20 to display an image. The cover window 20 may include transparent glass or plastic, and transmits an image displayed in the display panel 10 in a direction of a user (i.e., a third direction (z)).

In FIG. 1, it is exemplarily described that the first side portions D2 at opposite sides of the cover window 20 have side bent structures.

The cover window 20 includes a first plane portion D1 and the first side portion D2 that are provided at opposite sides of the first plane portion D1 in a first direction (x). The first direction (x) is perpendicular to the third direction (z). The first side portions D2 of the cover window 20 may form curved sides of which axes are in a second direction (y) that is perpendicular to the first direction (x) and the third direction (z), and the first side portions D2 of the cover window 20 may be called curved portions. The third direction (z) may be perpendicular to a plane provided by the first direction (x) and the second direction (y).

The first plane portion D1 and the first side portions D2 of the cover window 20 may correspond to an area where a main image of the display panel 10 is displayed. In an alternative exemplary embodiment, the first plane portion D1 of the cover window 20 may correspond to an area where a main image of the display panel 10 is displayed, and the first side portions D2 of the cover window 20 may correspond to an area where a side auxiliary image of the display panel 10 is displayed. That is, the display panel 10 may display the main image on the area corresponding to the first plane portion D1 and the first side portions D2, or may display the main image in the area corresponding to the first plane portion D1 of the cover window 20 and display the side auxiliary image in the area corresponding to the first side portions D2 of the cover window 20.

Referring to FIG. 2, the display panel 10 includes a substrate 110 and a plurality of pixels PX arranged on the substrate 110. The substrate 110 includes a first plane area PA1 corresponding to the first plane portion D1 of the cover window 20, and first curved areas CA1 corresponding to the first side portions D2 at opposite sides of the cover window 20. As the display panel 10 is bonded to the cover window 20, the first curved areas CA1 may form curved sides. The first curved areas CA1 may be disposed at opposite ends of the first plane area PA1 in the first direction (x). The plurality of pixels PX include a plurality of first type pixels PX1 disposed in the first plane area PA1 and a plurality of second type pixels PX2 disposed in the first curved areas CA1. Referring to FIG. 3, the second type pixels PX2 is one of which at least one non-flat portion Cv is provided in a light emitting diode, and the first type pixel PX1 is one of which a non-flat portion Cv is not provided in a light emitting diode. The non-flat portion Cv will be described as a recess portion later in the exemplary embodiment, but the non-flat portion Cv may be a convex portion or may be provided as protrusions and depressions including both a recess portion and a convex portion. That is, the first type pixel PX1 is a pixel of which the light emitting diode is provided in parallel with one side of the substrate 110, and the second type pixel PX2 is a pixel in which the non-flat portion Cv that forms a non-flat surface that is not parallel with one side of the substrate 110 is provided in the light emitting diode. The first type pixel PX1 and the second type pixel PX2 will be described in detail later with reference to FIGS. 4 to 7.

The second type pixel PX2 may be classified into various types depending on a type of non-flat portion Cv. In an exemplary embodiment, as shown in FIG. 3, the second type pixel PX2 may include a first pixel PX2a including one non-flat portion Cv, a second pixel PX2b including two non-flat portions Cv, and a third pixel PX2c including three non-flat portions Cv, for example.

In FIG. 3, although it is illustrated that the number of non-flat portions Cv included in the second type pixel PX2 is one to three for better understanding and ease of description, the number of non-flat portions Cv included in the second type pixel PX2 is not particularly limited, and the number of types of the second type pixel PX2 is not limited.

Hereinafter, the first pixel PX2a indicates a second type pixel PX2 including the smallest number of non-flat portions Cv, the second pixel PX2b indicates a second type pixel PX2 including a number of non-flat portions Cv that is greater than the number of non-flat portions Cv of the first pixel PX2a, and the third pixel PX2c indicates a second type pixel PX2 including a number of non-flat portions Cv that is greater than the number of non-flat portions Cv of the second pixel PX2b.

The first curved area CA1 may be divided into a plurality of areas depending on a distance from the first plane area PA1 in the first direction (x). In an exemplary embodiment, as shown in FIG. 3, the first curved area CA1 may be divided into a first sub-curved area CA1a, a second sub-curved area CA1b, and a third sub-curved area CA1c depending on a distance from the first plane area PA1 in the first direction (x), for example.

Although it is illustrated in FIG. 3 that the first curved area CA1 is divided into the first to third sub-curved areas CA1a, CA1b, and CA1c for better understanding and ease of description, the number of areas that the first curved area CA1 is divided into is not particularly limited.

Hereinafter, the first sub-curve area CA1a indicates an area that is most adjacent to the first plane area PA1, the second sub-curve area CA1b indicates an area that is disposed farther away from the first plane area PA1 than the first sub-curve area CA1a is, and the third sub-curve area CA1c indicates an area that is disposed father away from the first plane area PA1 than the second sub-curve area CA1b is.

The first type pixel PX1 is disposed in the first plane area PA1, and the second type pixel PX2 is disposed in the first curved area CA1. In addition, the first pixel PX2a among the second type pixels PX2 may be disposed in the first sub-curve area CA1a. Among the second type pixels PX2, the second pixel PX2b may be disposed in the second sub-curve area CA1b. Among the second type pixels PX2, the third pixel PX2c may be disposed in the third sub-curve area CA1c. That is, as the distance is increased from the first plane area PA1 in the first direction (x) in the first curved area CA1, the second type pixels PX2 including more non-flat portions Cv may be disposed. The number of non-flat portions Cv included in the second type pixels PX2 is increased as the distance from the first plane area PA1 in the first direction (x) increases. Further, when disposed closer to an edge of the display panel 10 from the first plane area PA1, the number of non-flat portions Cv included in the second type pixels PX2 may be increased.

Not only the first pixel PX2a may be located in the first sub-curve area CA1a, and the first type pixel PX1 may be disposed in the first sub-curve area CA1a together with the first pixel PX2a. In addition, not only the second pixel PX2b may be located in the second sub-curve area CA1b, and the first type pixel PX1 may be disposed in the second sub-curved area CA1b together with the second pixel PX2b. In addition, not only the third pixel PX2c may be located in the third sub-curve area CA1c, and the first type pixel PX1 may be disposed in the third sub-curve area CA1c together with the third pixel PC2c. In such a case, a distribution of the first type pixels PX1 in the curved area CA1 may be gradually reduced farther away from the first plane area PA1. Further, the first type pixels PX1 may be randomly arranged in the curved area CA1. That is, the first pixel PX2a, the second pixel PX2b, and the third pixel PX2c of the second type pixels PX2 may be gradually increased away from the first plane area PA1. An exemplary embodiment related to this will be described in detail later with reference to FIG. 22.

Referring to FIGS. 1 to 3, when the display panel 10 is bonded to the cover window 20, the first sub-curve area CA1a may be an area that is bent at an angle of about 0 to a first angle with reference to a plane of the first plane area PA1, the second sub-curve area CA1b is an area that is bent at the first angle to a second angle with reference to the plane of the first plane area PA1, and the third sub-curve area CA1c may be an area that is bent at an angle of the second angle to a third angle with reference to the plane of the first plane area PA1. In this case, the second angle is greater than the first angle, and the third angle is greater than the second angle. In an exemplary embodiment, when a cross-section of the curved portions provided by the first side portions D2 of the cover window 20 is a quarter circle and the first curved areas CA1 of the display panel 10 correspond to the first side portions D2 of the quarter circle of the cover window 20, the first angle may be about 30 degrees, the second angle may be about 60 degrees, and the third angle may be about 90 degrees, for example. However, the first sub-curve area CA1a, the second sub-curve area CA1b, and the third sub-curve area CA1c may have different widths, and accordingly, the first to third angles may be set to various angles.

As described, since the first to third sub-curve areas CA1a, CA1b, and CA1c are bent at different angles with reference to the plane of the first plane area PA1, the first plane area PA1 is seen as a plane in a plan view (e.g., seen from the top in FIG. 1), the first sub-curve area CA1a is seen as a side viewing angle tilted at zero to the first angle with reference to the first plane area PA1, the second sub-curve area CA1b is seen as a side viewing angle tilted at the first angle to the second angle with reference to the first plane area PA1, and the third sub-curve area CA1c is seen as a side viewing angle tilted at the second angle to the third angle with reference to the first plane area PA1. That is, as the side viewing angle is increased with reference to the first plane area PA1, the number of non-flat portions Cv included in the second type pixel PX2 may be increased. In an alternative exemplary embodiment, as the side viewing angle is increased with reference to the first plane area PA1, a distribution of the second type pixels PX2 may be gradually increased. Here, the plane of the first plane area PA1 may be a side that is parallel with one side of the substrate 110.

Hereinafter, a detailed structure of the first type pixel PX1 will be described with reference to FIG. 4, and a detailed structure of the second type pixel PX2 will be described with reference to FIGS. 5 to 7.

Figure 4:
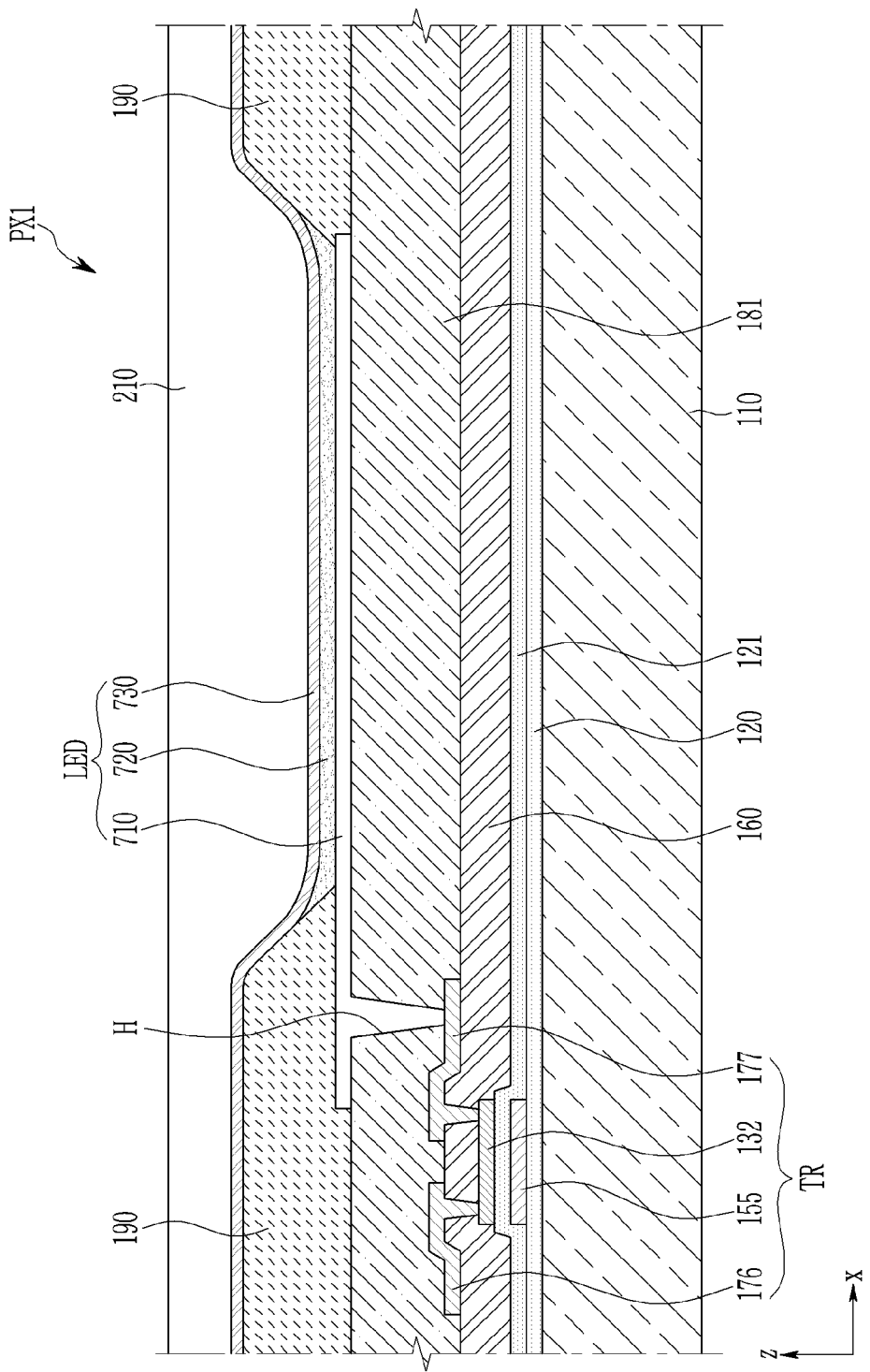
FIG. 4 shows a partial cross-section of the exemplary embodiment of a first type pixel in the display device according to the invention.

FIG. 4 is a partial cross-sectional view of the first type pixel in the display device according to the exemplary embodiment of the invention. FIG. 4 shows a cross-section of a driving transistor and a light emitting diode included in the first type pixel PX1 in the display panel 10 (refer to FIGS. 1 and 2).

Referring to FIG. 4, the display device includes a substrate 110, a driving transistor TR, a light emitting diode LED, and an encapsulation layer 210.

In an exemplary embodiment, the substrate 110 includes an insulation material such as glass, plastic, and the like, and a buffer layer 120 is disposed on the substrate 110. The buffer layer 120 prevents the penetration of impurity elements or unnecessary component such as moisture and the like, and planarizes a surface where the driving transistor TR is disposed. The buffer layer 120 may be omitted depending on the type and process conditions of the substrate 110.

A gate electrode 155 is disposed on the buffer layer 120. A first insulation layer 121 is disposed on the gate electrode 155 and the buffer layer 120. A semiconductor layer 132 including amorphous silicon, polysilicon, or an oxide semiconductor is disposed on the first insulation layer 121. The semiconductor layer 132 overlaps the gate electrode 155. The first insulation layer 121 may include a single layer of a silicon nitride or a silicon oxide, or a multi-layer structure in which a silicon nitride and a silicon oxide are laminated. A second insulation layer 160 is disposed on the semiconductor layer 132 and the first insulation layer 121. A source electrode 176 and a drain electrode 177 that face each other are disposed on the second insulation layer 160. The source electrode 176 may be connected to one end of the semiconductor layer 132 through a contact hole that penetrates the second insulation layer 160. The drain electrode 177 may be connected to the other end of the semiconductor layer 132 through another contact hole that penetrates the second insulation layer 160. The gate electrode 155, the source electrode 176, the drain electrode 177, and the semiconductor layer 132 form a single driving transistor TR. A channel of the driving transistor TR is provided in a portion of the semiconductor layer 132 between the source electrode 176 and the drain electrode 177.

A third insulation layer 181 is disposed on the driving transistor TR and an exposed portion of the second insulation layer 160. The third insulation layer 181 may include an organic insulation material. A pixel electrode 710 is disposed on the third insulation layer 181, and the pixel electrode 710 is connected with the drain electrode 177 of the driving transistor TR through a contact hole H that penetrates the third insulation layer 181. The driving transistor TR provides a current corresponding to a data voltage to the pixel electrode 710. An emission layer 720 is disposed on the pixel electrode 710, and a power source electrode 730 is disposed on the emission layer 720. The emission layer 720 may include at least one of an organic light emitting material and an inorganic light emitting material. One of the pixel electrode 710 and the power source electrode 730 may be a reflective electrode and the other may be a semi-transmissive electrode. In an exemplary embodiment, when the display device has a top emission structure, the pixel electrode 710 may be a reflective electrode and the power source electrode 730 may be a semi-transmissive electrode, for example. In the exemplary embodiment, the pixel electrode 710 may include a metallic material having high reflectance, such as silver (Ag), gold (Au), platinum (Pt), copper (Cu), molybdenum (Mo), aluminum (Al), and the like, for example. In an exemplary embodiment, the pixel electrode 710 may further include a transparent conductive material such as an indium-tin oxide ("ITO") or an indium-zinc oxide ("IZO") and the like, disposed between the emission layer 720 and the metallic material. The pixel electrode 710 may further include an ITO or an IZO disposed between the third insulation layer 181 and the metallic material. In an exemplary embodiment, the power source electrode 730 may include a metallic material such as silver (Ag), gold (Au), platinum (Pt), copper (Cu), molybdenum (Mo), aluminum (Al), and the like, and in this case, the power source electrode 730 may include a thin film having a transflective characteristic.

The pixel electrode 710, the emission layer 720, and the power source electrode 730 form the light emitting diode LED. The pixel electrode 710 may become an anode of the light emitting diode LED, and the power source electrode 730 may be a cathode of the light emitting diode LED. In an alternative exemplary embodiment, depending on exemplary embodiments, the pixel electrode 710 may be a cathode of the light emitting diode LED and the power source electrode 730 may be an anode of the light emitting diode LED. The hole and the electron are injected into the emission layer 720 from the pixel electrode 710 and the power source electrode 730, respectively, and an exciton generated by coupling the injected hole and electron falls from an excited state to a ground state to emit light. The light emitting diode LED may emit light of one of primary colors. The primary colors exemplarily include red, green, and blue.

In an alternative exemplary embodiment, the primary colors may exemplarily include yellow, cyan, and magenta, for example.

Light emitted from the emission layer 720 is reflected by the pixel electrode 710 and moves toward the power source electrode 730, and a part of light incident on the power source electrode 730 is passed through the power source electrode 730 and moves in the third direction (z) (i.e., toward the user) and the rest of the light incident on the power source electrode 730 moves toward the pixel electrode 710.

As described, since the pixel electrode 710 includes a metallic material having high reflectance and the power source electrode 730 include a metallic material having a transflective characteristic, light emitted from the emission layer 720 experiences resonance between the pixel electrode 710 and the power source electrode 730 such that light of a specific wavelength is amplified and emitted in the third direction (z), thereby improving optical efficiency and color reproducibility.

A pixel defining layer 190 that defines an area of the light emitting diode LED, that is, a pixel area where light is emitted, may be disposed at the periphery of the pixel electrode 710. The pixel defining layer 190 is disposed on a part of the pixel electrode 710, and the emission layer 720 may be disposed on a portion of the pixel electrode 710 not covered by the pixel defining layer 190. An area where the emission layer 720 is disposed may be the pixel area.

The encapsulation layer 210 may be disposed on the light emitting diode LED to protect the light emitting diode LED.

As shown in FIG. 4, the light emitting diode LED included in the first type of pixel PX1, that is, the pixel electrode 710, the emission layer 720, and the power source electrode 730, does not include a non-flat portion Cv that is not parallel with one side of the substrate 110. The non-flat portion Cv will be described later. That is, each of the pixel electrode 710, the emission layer 720, and the power source electrode 730 may mostly include a side that is parallel with one side of the substrate 110.

Figure 5:
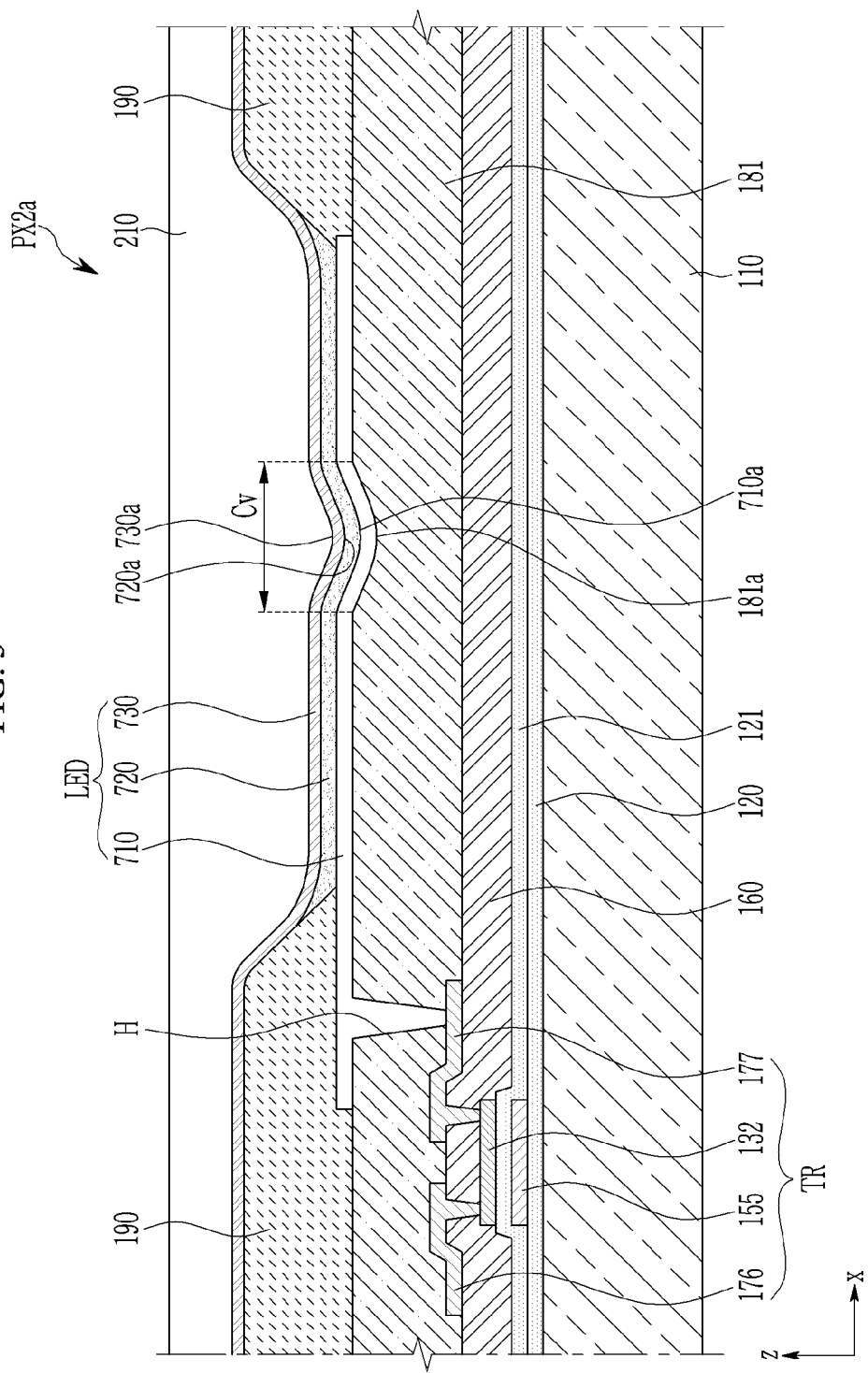
FIG. 5 shows a partial cross-section of the exemplary embodiment of a first pixel of a second type pixel in the display device according to the invention.

FIG. 5 is a partial cross-sectional view of a first pixel of the second type pixel in the display device according to the exemplary embodiment of the invention. FIG. 5 is a cross-sectional view of a driving transistor and a light emitting diode included in the first pixel PX2a (refer to FIG. 3) of the second type pixel PX2 (refer to FIG. 3) in the display panel 10 (refer to FIGS. 1 and 2), and a difference from FIG. 4 will be described.

Referring to FIG. 5, the third insulation layer 181 includes a first concave pattern 181a disposed in a pixel area that is defined by the pixel defining layer 190 in the first pixel PX2a of the second type pixel PX2. In addition, the pixel electrode 710 disposed on the third insulation layer 181 includes a second concave pattern 710a corresponding to the first concave pattern 181a, the emission layer 720 disposed on the pixel electrode 710 includes a third concave pattern 720a corresponding to the second concave pattern 710a, and the power source electrode 730 disposed on the emission layer 720 includes a fourth concave pattern 730a corresponding to the third concave pattern 720a. The first to fourth concave patterns 181a, 710a, 720a, and 730a may overlap each other in the third direction (z), and may form the non-flat portion Cv. The light emitting diode LED may include a non-flat side that is not parallel with one side of the substrate 110 by the non-flat portion Cv.

In a manufacturing process of the display panel 10, the first concave pattern 181a of the third insulation layer 181 may be provided by a half-tone mask when the contact hole H is defined after deposition of an organic material on the driving transistor TR. Since the pixel electrode 710, the emission layer 720, and the power source electrode 730 are sequentially disposed on the third insulation layer 181 where the first concave pattern 181a is provided, the second to fourth concave patterns 710a, 720a, and 730a that correspond to the first concave pattern 181a may be provided.

The non-flat portion Cv may include a portion that is lower than the surrounding area, but the periphery of the non-flat portion may be a convex portion that is higher than the lower portion of the non-flat portion Cv.

As the non-flat portion Cv is provided in the pixel area, light emitted from the emission layer 720 is partially scattered by the non-flat portion Cv such that a resonance effect may be reduced. Accordingly, optical efficiency and color reproducibility of the first pixel PX2a of the second type pixel PX2 may be lowered compared to the first type pixel PX1.

Except for such a difference, features of the exemplary embodiment described with reference to FIG. 4 may be applied to the exemplary embodiment described with reference to FIG. 5, and therefore a duplicated description between the exemplary embodiments will be omitted.

Figure 6:
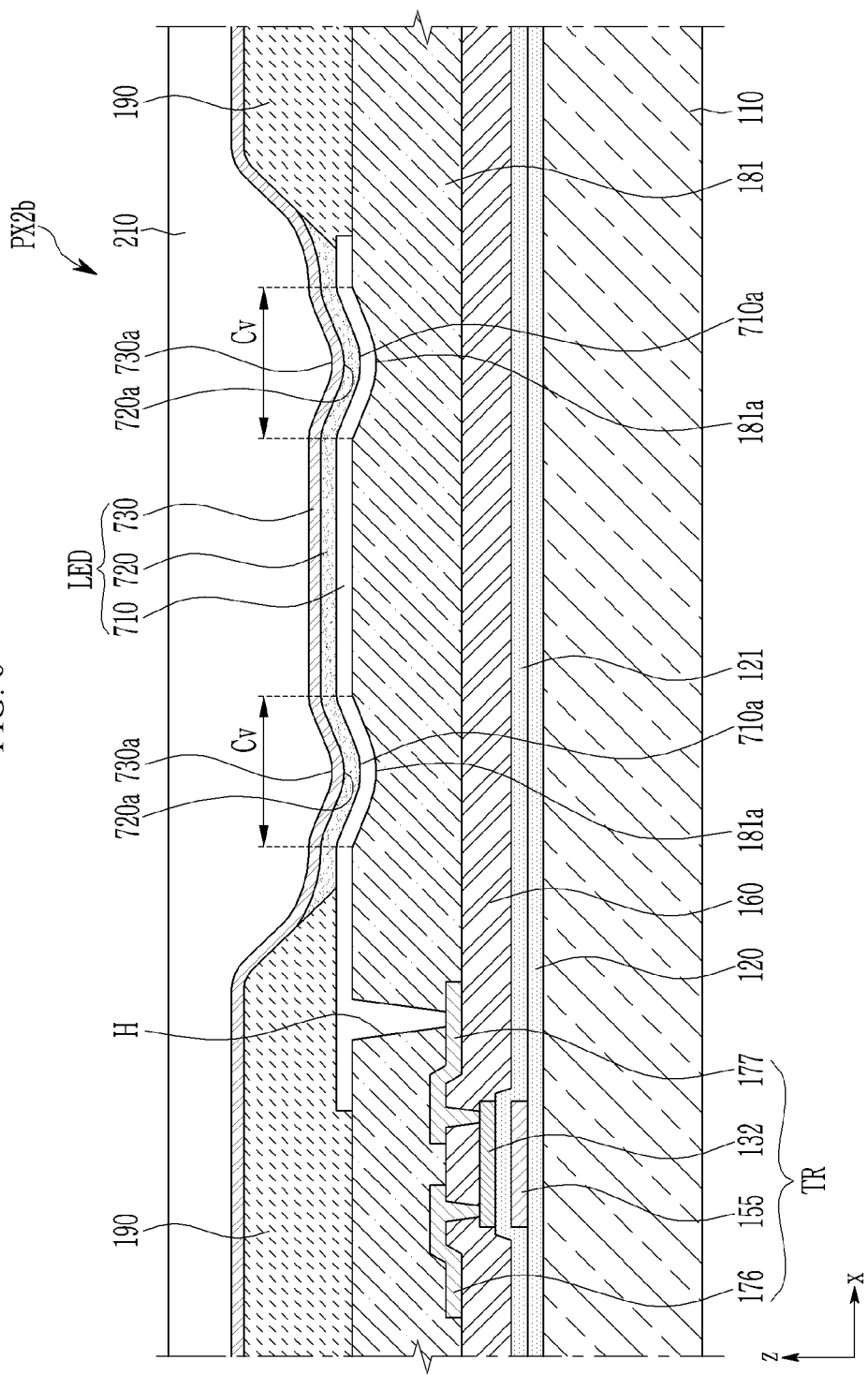
FIG. 6 shows a partial cross-section of the exemplary embodiment of a second pixel of the second type pixel in the display device according to the invention.

FIG. 6 is a partial cross-sectional view of the second pixel of the second type pixel in the display device according to the exemplary embodiment of the invention. FIG. 6 shows a cross-section of the driving transistor and the light emitting diode included in the second pixel PX2b of the second type pixel PX2, and a difference from FIGS. 4 and 5 will be described.

Referring to FIG. 6, in the second pixel PX2b of the second type pixel PX2, the third insulation layer 181 includes two first concave patterns 181a that are disposed in a pixel area defined by the pixel defining layer 190. The pixel electrode 710 disposed on the third insulation layer 181 includes two second concave patterns 710a corresponding to the two first concave patterns 181a, the emission layer 720 includes two third concave patterns 720a corresponding to the two second concave patterns 710a, and the power source electrode 730 disposed on the emission layer 720 includes two fourth concave patterns 730a corresponding to the two third concave patterns 720a.

Accordingly, the second pixel PX2b of the second type pixel PX2 may include two non-flat portions Cv in the pixel area. Since two non-flat portions Cv are provided in the pixel area, optical efficiency and color reproducibility of the second pixel PX2b of the second type pixel PX2 may be lowered compared to the first pixel PX2a shown in FIG. 5.

Except for such a difference, features described with reference to FIGS. 4 and 5 may be applied to the exemplary embodiment of FIG. 6, and a duplicated description between the exemplary embodiments will be omitted.

Figure 7:
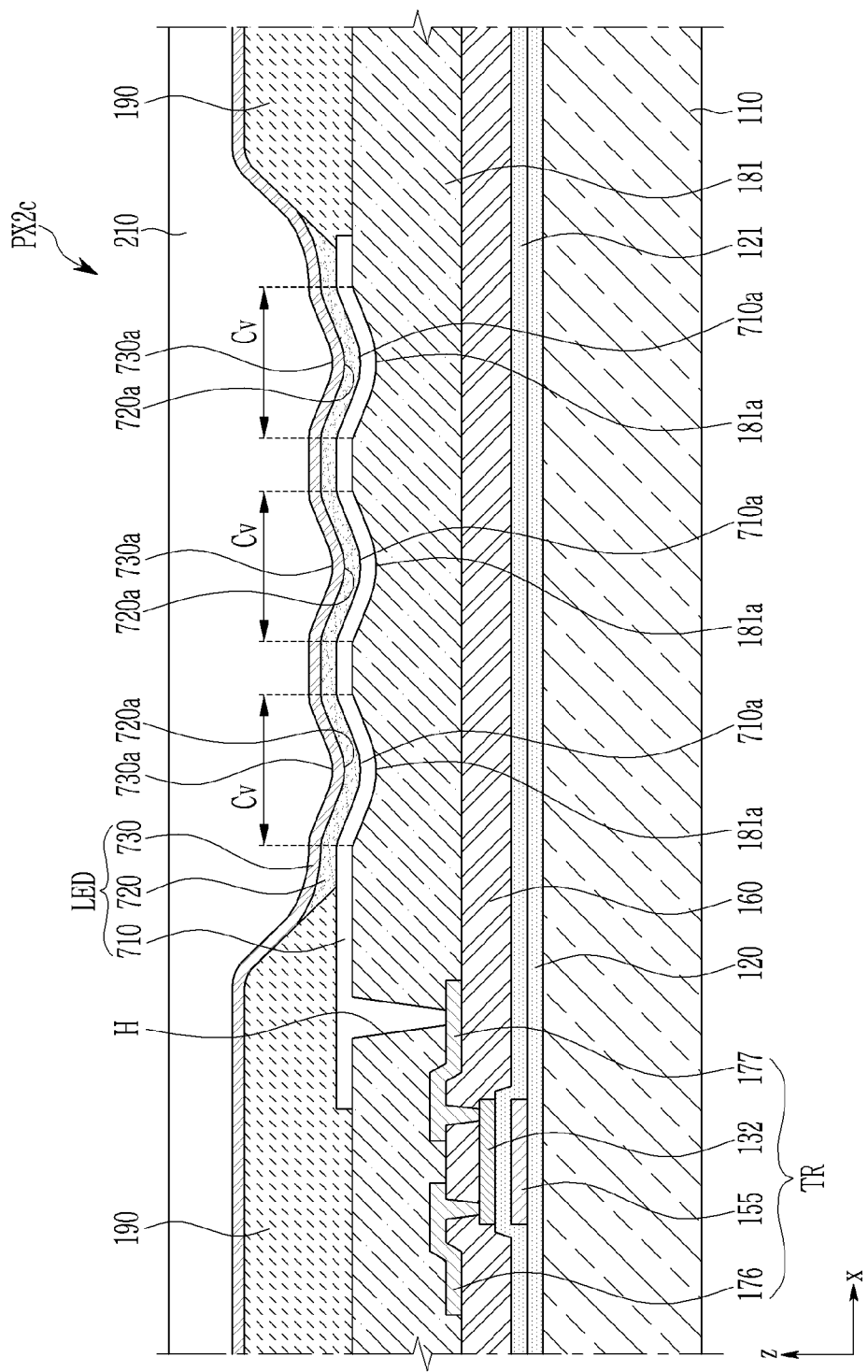
FIG. 7 shows a partial cross-section of the exemplary embodiment of a third pixel of the second type pixel in the display device according to the invention.

FIG. 7 is a partial cross-sectional view of the third pixel of the second type pixel in the display device according to the exemplary embodiment of the invention. FIG. 7 shows a cross-section of the driving transistor and the light emitting diode included in the third pixel PX2c of the second type pixel PX2 in the display panel 10, and a difference from FIGS. 4 to 6 will be described.

Referring to FIG. 7, the third insulation layer 181 includes three first concave patterns 181a disposed in a pixel area defined by the pixel defining layer 190 in the second type pixel PX2. The pixel electrode 710 disposed on the third insulation layer 181 includes three second concave patterns 710a corresponding to the three first concave patterns 181a, the emission layer 720 disposed on the pixel electrode 710 includes three third concave patterns 720a corresponding to the three second concave patterns 710a, and the power source electrode 730 disposed on the emission layer 720 includes three fourth concave patterns 730a corresponding to the three third concave patterns 720a.

Accordingly, the third pixel PX2c of the second type pixel PX2 may include three non-flat portions Cv in the pixel area. As the three non-flat portions Cv are provided in the pixel area, optical efficiency and color reproducibility of the third pixel PX2c of the second type pixel PX2 may be lowered compared to the second pixel PX2b shown in FIG. 6.

Except for such a difference, features described with reference to FIGS. 4 to 6 may be applied to the exemplary embodiment of FIG. 7, and therefore the same description as described above will be omitted.

The first type pixel PX1 and the second type pixel PX2 described with reference to FIGS. 1 to 7 may include a pixel emitting light of one of primary colors. In an exemplary embodiment, the first type pixel PX1 and the second type pixel PX2 may include a red pixel emitting red light, a green pixel emitting green light, and a blue pixel emitting blue light, for example. A desired color may be displayed by spatially or temporally combining red, green, and blue. Depending on exemplary embodiments, the first type pixel PX1 and the second type pixel PX2 may emit light of a combination of the primary colors or a light of white, for example.

Hereinafter, it will be exemplarily described that the first type pixel PX1 and the second type pixel PX2 include red pixels, green pixels, and blue pixels.

The number of non-flat portions Cv included in the red pixel, the green pixel, and the blue pixel included in the second type pixel PX2 may be different from each other. An exemplary embodiment related to this will now be described in detail with reference to FIGS. 8 and 9.

Figure 8:
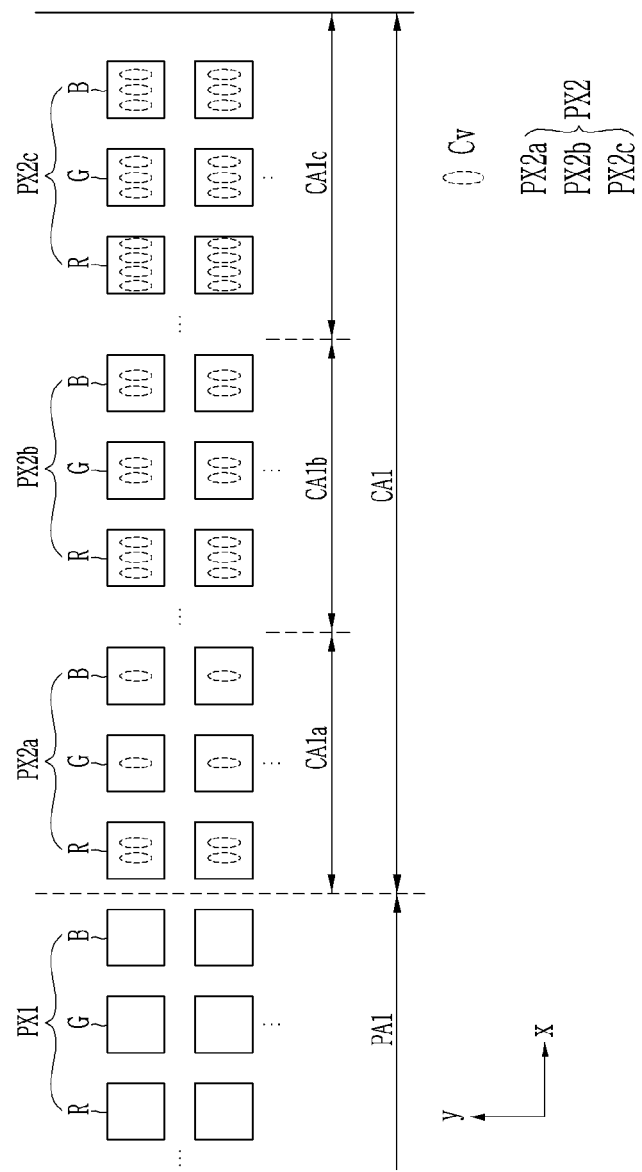
FIG. 8 shows an exemplary embodiment of alignment of red pixels, green pixels, and blue pixels.

FIG. 8 shows an exemplary embodiment of an alignment of red pixels, green pixels, and blue pixels.

Referring to FIG. 8, the first type pixels PX1 disposed in the first plane area PA1 may include red pixels R, green pixels G, and blue pixels B. Among the second type pixels PX2 disposed in the first curved area CA1, the first pixels PX2a disposed in the first sub-curve area CA1a may include red pixels R, green pixels G, and blue pixels B. Among the second type pixels PX2 disposed in the first curved area CA1, the second pixels PX2b disposed in the second sub-curve area CA1b may include red pixels R, green pixels G, and blue pixels B. Among the second type pixels PX2 disposed in the first curved area CA1, the third pixels PX2c disposed in the third sub-curve area CA1c may include red pixels R, green pixels G, and blue pixels B. The red pixels R, the green pixels G, and the blue pixels B in the first curved area CA1 include non-flat portions Cv.

The number of non-flat portions Cv included in the red pixel R disposed in the second sub-curve area CA1b may be greater than the number of non-flat portions Cv included in the red pixel R disposed in the first sub-curve area CA1a, and the number of non-flat portions Cv of the red pixel R disposed in the third sub-curve area CA1c may be greater than the number of non-flat portions Cv included in the red pixel R disposed in the second sub-curve area CA1b.

In addition, the number of non-flat portions Cv included in the green pixel G disposed in the second sub-curve area CA1b may be greater than the number of non-flat portions Cv included in the green pixel G disposed in the first sub-curve area CA1a, and the number of non-flat portions Cv included in the green pixel G disposed in the third sub-curve area CA1c may be greater than the number of non-flat portions Cv included in the green pixel G disposed in the second sub-curve area CA1b.

Further, the number of non-flat portions Cv included in the blue pixel B disposed in the second sub-curve area CA1b may be greater than the number of non-flat portions Cv included in the blue pixel B disposed in the first sub-curve area CA1a, and the number of non-flat portions Cv included in the blue pixel B disposed in the third sub-curve area CA1c may be greater than the number of non-flat portions Cv included in the blue pixel B disposed in the second sub-curve area CA1b.

As described, each of the red pixel R, the green pixel G, and the blue pixel B disposed in the first curved area CA1 may include more non-flat portions Cv while being farther away from the first plane area PA1 in the first direction (x). That is, as the distance is farther away from the first plane area PA1 in the first direction (x), the number of non-flat portions Cv included in each of the red, green, and blue pixels R, G, and B may be increased. Further, when disposed closer to the edge of the display panel 10 from the first plane area PA1, the number of non-flat portions Cv included in each of the red pixel R, the green pixel G, and the blue pixel B may be increased.

Red pixels R, green pixels G, and blue pixels B that are disposed adjacent to the first curved area CA1 may include the same number of non-flat portions Cv or a different number of non-flat portions Cv. In an exemplary embodiment, as shown in FIG. 8, in the first sub-curve area CA1a, the red pixel R may include two non-flat portions Cv and the green pixel G and the blue pixel B may respectively include one non-flat portion Cv, for example. In addition, in the second sub-curve area CA1b, the red pixel R may include three non-flat portions Cv and the green pixel G and the blue pixel B may respectively include two non-flat portions Cv. Further, in the third sub-curve area CA1c, the red pixel R may include four non-flat portions Cv and the green pixel G and the blue pixel B may respectively include three non-flat portions Cv.

If the red pixel R, the green pixel G, and the blue pixel B disposed in the first curved area CA1 do not include a non-flat portion Cv, a color of the first curved area CA1 seen at the side viewing angle may become reddish or bluish. That is, due to the resonance effect of the light emitting diode LED, red light may be reinforced or blue light may be reinforced compared to other light so that a reddish or bluish color may occur. Such a color failure of the first curved area CA1 may vary depending on a structure of the light emitting diode LED or a curvature of the first curved area CA1.

The color failure of the first curved area CA1 may be solved by reducing reinforcement of light compared to other light in the first curved area CA1. In an exemplary embodiment, when a color of light becomes reddish in the first curved area CA1, as shown in FIG. 8, the number of non-flat portions Cv included in the red pixel R is designed to be greater than the number of non-flat portions Cv included in the green pixel G or the blue pixel B in the first curved area CA1 so that color reproducibility of the red pixel R may be lowered compared to that of the green pixel G or the blue pixel G, thereby resolving the color failure, for example.

Figure 9:
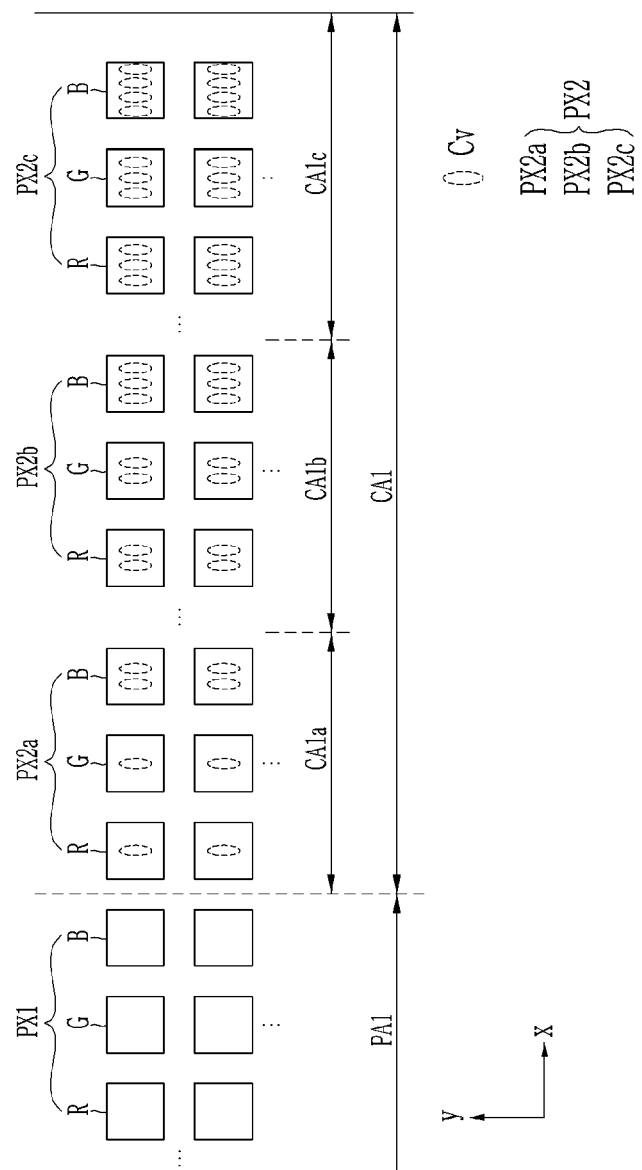
FIG. 9 shows another exemplary embodiment of alignment of red pixels, green pixels, and blue pixels.

FIG. 9 shows another exemplary embodiment of an alignment of red pixels, green pixels, and blue pixels. Only a difference from FIG. 8 will be mainly described.

Referring to FIG. 9, red pixels R and green pixels G in the first sub-curve area CA1a respectively include one non-flat portion Cv, and blue pixels B may include two non-flat portions Cv. In addition, in the second sub-curve area CA1b, red pixels R and green pixels G may respectively include two non-flat portions Cv, and blue pixels B may include three non-flat portions Cv. In addition, in the third sub-curve area CA1c, red pixels R and green pixels G may respectively include three non-flat portions Cv, and blue pixels B may include four non-flat portions Cv.

Depending on a structure of the light emitting diode LED and a curvature with which the first curved area CA1 is bent, bluishness may occur in the first curved area CA1. In this case, as shown in FIG. 9, the number of non-flat portions Cv included in the blue pixel B is designed to be greater than the number non-flat portions Cv included in the red pixel R or the green pixel G so that color reproducibility of the blue pixel B may be lowered compared to that of the red pixel R or the green pixel G, thereby resolving the color failure.

Except for such a difference, features of the exemplary embodiment shown in FIG. 8 may be applied to the exemplary embodiment of FIG. 9, and therefore a duplicated description between the exemplary embodiments will be omitted.

The numbers of non-flat portions Cv included in the red pixel R, the green pixel G, and the blue pixel B shown in FIGS. 8 and 9 are exemplarily provided, and the numbers of non-flat portions Cv included in the red pixel R, the green pixel G, and the blue pixel B are not limited.

Hereinafter, a display device according to another exemplary embodiment will be described with reference to FIGS. 10 to 11. Differences from FIGS. 1 to 9 described above will be mainly described.

FIG. 10 shows a display device according to another exemplary embodiment of the invention. FIG. 11 shows a display panel included in the display device of FIG. 10.

Figure 11:
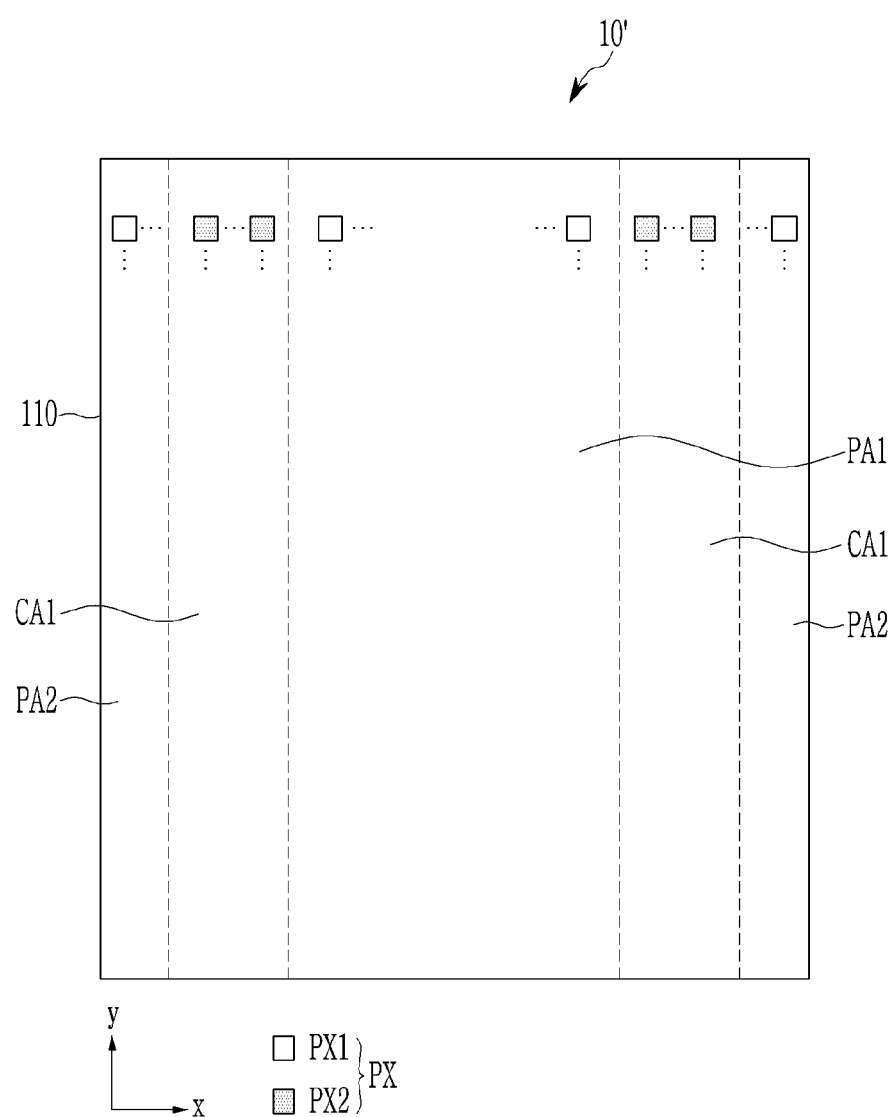
FIG. 11 shows a display panel included in the display device of FIG. 10.

Referring to FIGS. 10 and 11, a display device includes a display panel 10' where an image is displayed, and a cover window 20 that protects the display panel 10'.

The cover window 20 includes a first plane portion D1 and first side portions D2 provided at opposite ends of the first plane portion D1 in a first direction (x), and each of the first side portions D1 includes a curved portion D2r extended from the first plane portion D1 and a second plane portion D2s extended from the curved portion D2r. The second plane portions D2s may be perpendicular to the first plane portion D1, and a cross-section of each curved portion D2r may be a quarter circle. A curvature radius of the curved portion D2r may be variously set as necessary, and there is no limit in the size of the curvature radius.

The first plane portion D1 and the curved portions Dr2 of the cover window 20 may correspond to an area where a main image of the display panel 10' is displayed, and the second plane portions D2s of the cover window 20 may correspond to an area where a side auxiliary image of the display panel 10' is displayed. In an alternative exemplary embodiment, the first plane portion D1 of the cover window 20 may correspond to an area where a main image of the display panel 10' is displayed, and the curved portions D2r and the second plane portions D2s of the cover window 20 may correspond to an area where a side auxiliary image of the display panel 10' is displayed.

Referring to FIG. 11, the display panel 10' includes a substrate 110 and a plurality of pixels PX arranged on the substrate 110. The substrate 110 may include a first plane area PA1 corresponding to the first plane portion D1 of the cover window 20, first curved areas CA1 corresponding to the curved portions D2r at opposite ends of the cover window 20, and second plane areas PA2 corresponding to the second plane portions D2s at opposite ends of the cover window 20. The plurality of pixels PX include a plurality of first type pixels PX1 disposed in the first plane area PA1 and the second plane area PA2, and a plurality of second type pixels PX2 disposed in the first curved areas CA1. As a distance becomes greater from the first plane area PA1 in the first direction (x) in the first curved area CA1, the second type pixels PX2 including more non-flat portions Cv may be disposed.

When a user views the display device in a plan view (e.g., seen from the top in FIG. 10), the second plane areas PA2 may not be seen by the user. In the second plane areas PA2, which is the areas not seen by the user in the plan view, the second type pixels PX2 that include the non-flat portions Cv may not need to be arranged, and accordingly, the first type pixels PX1 may be arranged. However, the second type pixels PX2 may be arranged in the second plane area PA2 as necessary.

Except for such a difference, features of the exemplary embodiments described above with reference to FIGS. 1 to 9 may be applied to the exemplary embodiment described with reference to FIGS. 10 and 11, and therefore a duplicated description of the exemplary embodiments will be omitted.

Hereinafter, a display device according to still another exemplary embodiment of the invention will be described with reference to FIGS. 12 to 15. Only a difference from FIGS. 1 to 9 will be mainly described.

Figure 12:
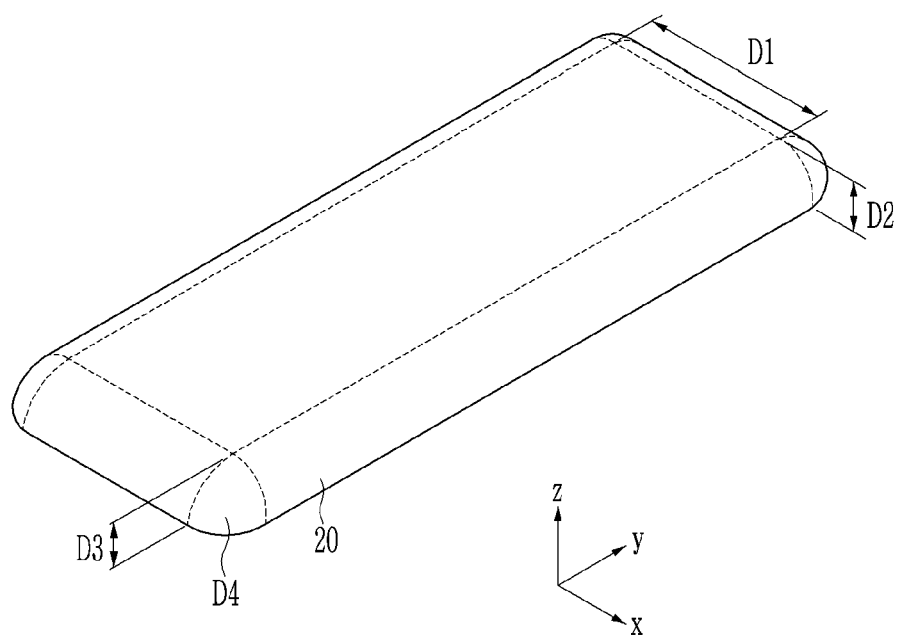
FIG. 12 shows another exemplary embodiment of a display device according to the invention.
Figure 13:
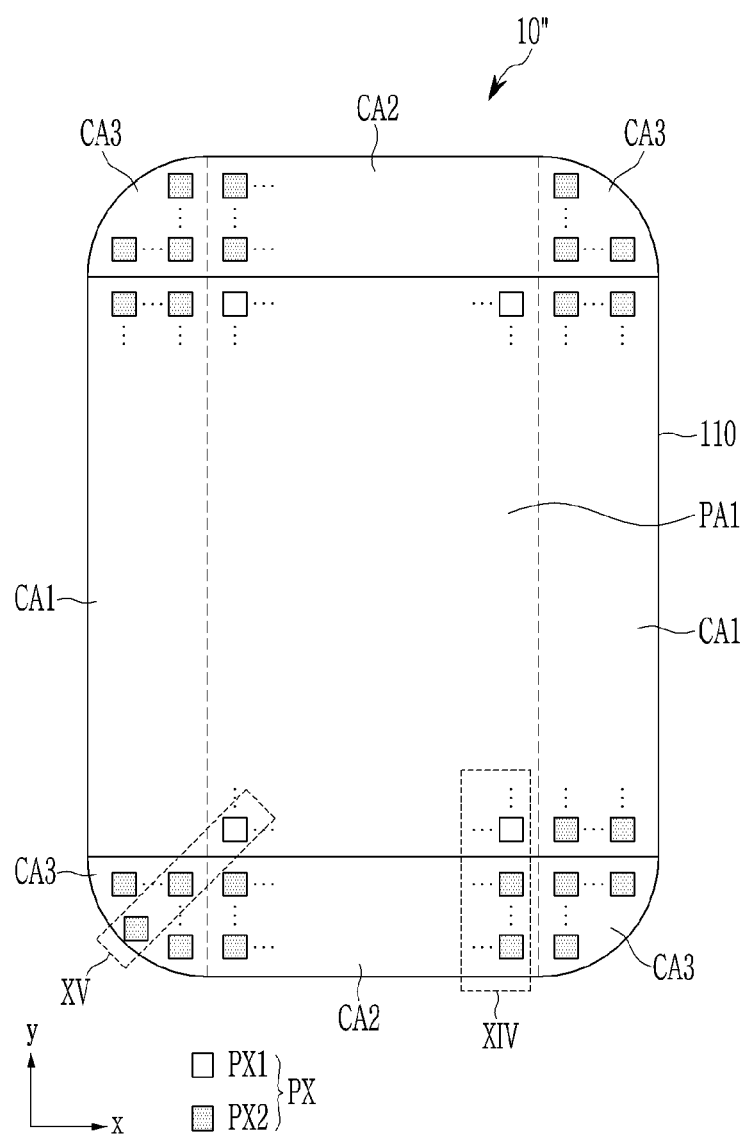
FIG. 13 shows a display panel included in the display device of FIG. 12.
Figure 14:
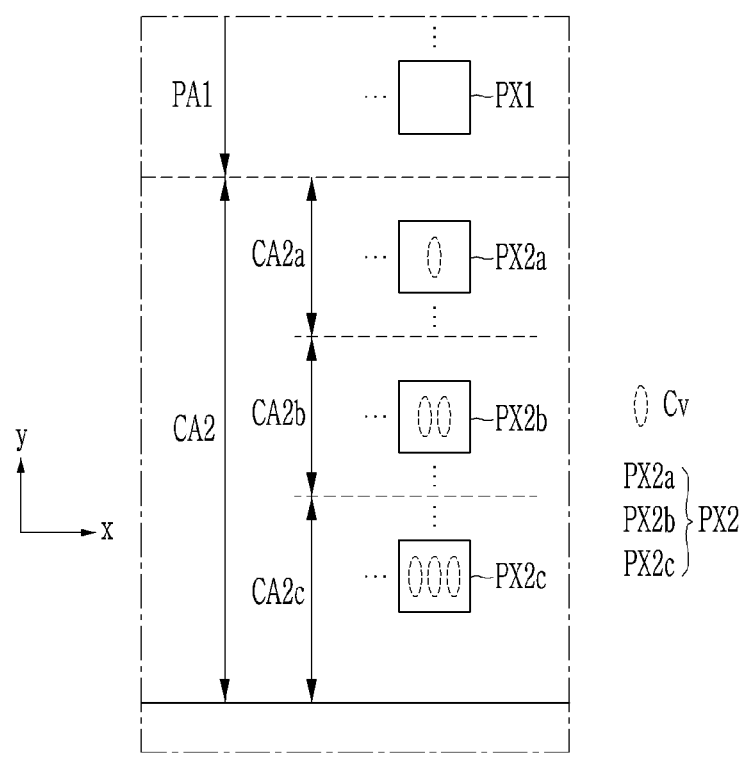
FIG. 14 shows area XIV of FIG. 13 in detail.
Figure 15:
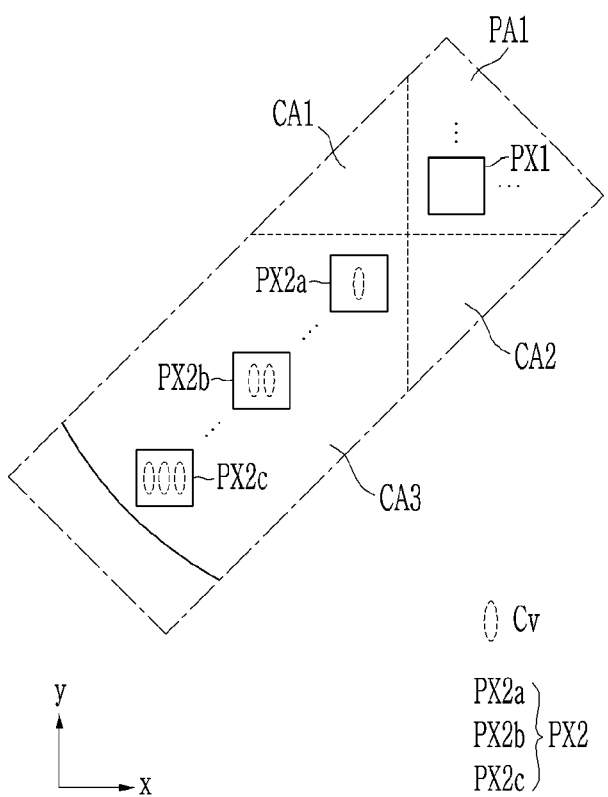
FIG. 15 shows area XV of FIG. 13 in detail.

FIG. 12 shows a display device according to another exemplary embodiment of the invention. FIG. 13 shows a display panel included in the display device of FIG. 12. FIG. 14 illustrates area XIV of FIG. 13 in detail. FIG. 15 illustrates area XV of FIG. 13 in detail.

Referring to FIGS. 12 to 15, a display device includes a display panel 10" where an image is displayed, and a cover window 20 that protects the display panel 10".

The cover window 20 includes a first plane portion D1, first side portions D2 at opposite ends of the first plane portion D1 in a first direction (x), second side portions D3 at opposite ends of the first plane portion D1 in a second direction (y), and third side portions D4 disposed between the first side portions D2 and the second side portions D3. The first side portions D2 may form curved sides of which an axis is in the second direction (y), the second side portions D3 may form curved sides of which axes are in the first direction (x), and the third side portions D4 may form curved sides that connect the first side portions D2 and the second side portions D3 with each other. The third side portions D4 may form sphere-shaped curved sides with respect to a plurality of axes between the first direction (x) and the second direction (y). The display panel 10" may be bonded to a rear side of the cover window 20 according to a shape of the cover window 20.

The first plane portion D1 and the first to third side portions D2, D3, and D4 of the cover window 20 may correspond to an area where a main image of the display panel 10" is displayed. In an alternative exemplary embodiment, at least one of the first to third side portions D2, D3, and D4 of the cover window 20 may correspond to an area where a side auxiliary image of the display panel 10" is displayed. That is, the display panel 10" may display a main image in an area that corresponds to the first plane portion D1 and the first to third side portions D2, D3, and D4 of the cover window 20, or may display a side auxiliary image in an area corresponding to at least one of the first to third side portions D2, D3, and D4 of the cover window 20.

The display panel 10" includes a substrate 110 and a plurality of pixels PX arranged on the substrate 110. The substrate 110 may include a first plane area PA1 corresponding to the first plane portion D1, first curved areas CA1 corresponding to the first side portions D2 of the cover window 20, second curved areas CA2 corresponding to the second side portions D3 of the cover window 20, and third curved areas CA3 corresponding to the third side portions D4 of the cover window 20. As the display panel 10″ is bonded to the cover window 20, the first curved areas CA1, the second curved areas CA2, and the third curved areas CA3 may form curved sides. The third curved areas CA3 are disposed between the first curved areas CA1 and the second curved areas CA2, and may connect the first curved areas CA1 and the second curved areas CA2 with each other. The plurality of pixel PX include a plurality of first type pixels PX1 disposed in the first plane area PA1, and a plurality of second type pixels PX2 disposed in the first to third curved areas CA1, CA2, and CA3. However, depending on exemplary embodiments, the second type pixels PX2 are not disposed in at least one of the first to third curved areas CA1, CA2, and CA3, and the first type pixels PX1 may be disposed therein.

The second curved areas CA2 may be divided into a plurality of areas depending on a distance from the first plane area PA1 in the second direction (y). In an exemplary embodiment, as shown in FIG. 14, the second curved area CA2 may be divided into a first sub-curved area CA2*a*, a second sub-curved area CA2*b*, and a third sub-curved area CA2*c* depending on a distance from the first plane area PA1 in the second direction (y), for example.

Although it is illustrated in FIG. 14 that the second curved area CA2 is divided into the first to third sub-curved areas CA2*a*, CA2*b*, and CA2*c* for better understanding and ease of description, the number of divisions of the second curved area CA2 is not particularly limited.

First pixels PX2*a* among the second type pixels PX2 may be disposed in the first sub-curved area CA2*a* of the second curved area CA2, second pixels PX2*b* among the second type pixels PX2 may be disposed in the second sub-curved area CA2*b* of the second curved area CA2, and third pixels PX2*c* among the second type pixels PX2 may be disposed in the third sub-curved area CA2*c* of the second curved area CA2. That is, in the second curved area CA2, the second type pixels PX2 including more non-flat portions Cv may be disposed as the distance becomes greater from the first plane area PA1 in the second direction (y). As the distance becomes greater from the first plane area PA1 in the second direction (y), the number of non-flat portions Cv included in the second type pixel PX2 may be increased. When disposed closer to an edge of the display panel 10″ from the first plane area PA1, the number of non-flat portions Cv included in the second type pixel PX2 may be increased.

In the same manner as the second type pixels PX2 being arranged in the first curved area CA1 and the second curved area CA2, in the third curved area CA3, the second type pixels PX2 including more non-flat portions Cv may be disposed as the distance becomes greater from the first plane area PA1 in the first direction (x) and the second direction (y). In an exemplary embodiment, as shown in FIG. 15, a first pixel PX2*a* among the second type pixels PX2 may be disposed at a location that is close to the first plane area PA1, a third pixel PX2*c* among the second type pixels PX2 may be disposed at a location away from the first plane area PA1, and a second pixel PX2*b* may be disposed between the first pixel PX2*a* and the third pixel PX2*c*, for example.

Except for such a difference, features of the exemplary embodiment shown in FIGS. 1 to 9 may be applied to the exemplary embodiment of FIGS. 12 to 15, and therefore a duplicated description between the exemplary embodiments will be omitted.

Hereinafter, a display device according to still another exemplary embodiment will be described with reference to FIGS. 16 and 17. Differences will be mainly described with reference to FIGS. 1 to 9 described above.

Figure 16:
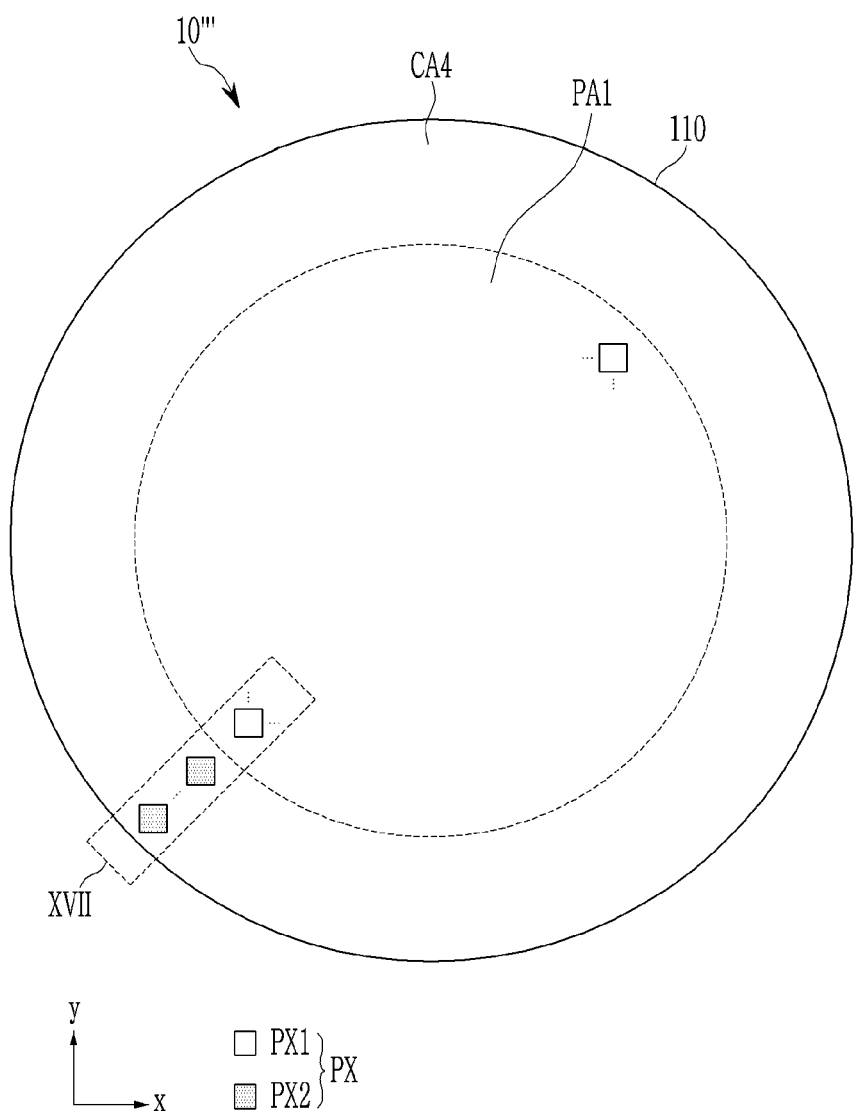
FIG. 16 shows another exemplary embodiment of a display panel according to the invention.

FIG. 16 shows a display panel of a display device according to still another exemplary embodiment of the invention. FIG. 17 shows area XVII of FIG. 16 in detail.

Figure 17:
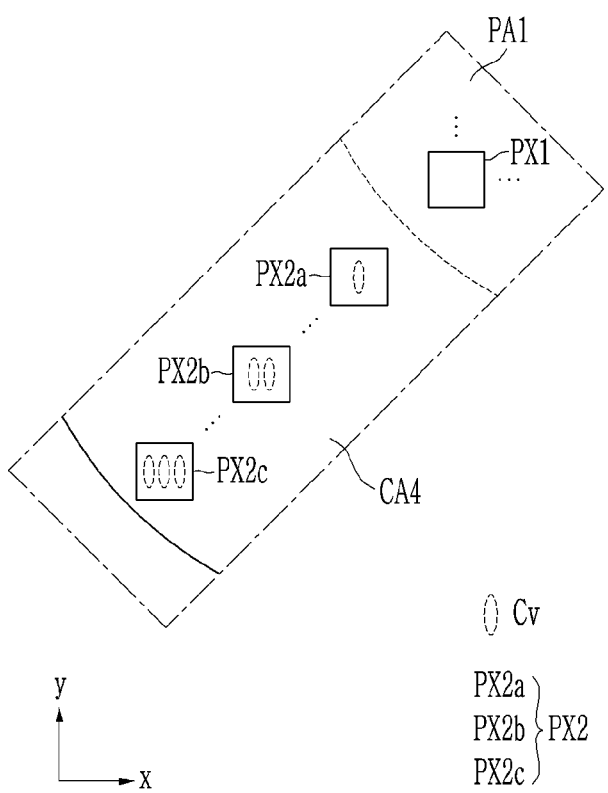
FIG. 17 shows area XVII of FIG. 16 in detail.

Referring to FIGS. 16 and 17, a display device may be provided in the shape of a circle. In this case, a cover window (not shown) may also be provided in the shape of a circle, a center portion of the cover window may be provided to be flat, and an edge of the cover window may form a sphere-shape curved side with respect to a plurality of axes.

A substrate 110 of a display panel 10‴ bonded to such a cover window is provided in the shape of a circle, and a plurality of pixels PX may be arranged on the substrate 110. The substrate 110 of the display panel 10‴ includes a first plane area PA1 at a center portion thereof, and a ring-shaped curved area CA4 at the edge of the first plane area PA1, and a plurality of first type pixels PX1 may be disposed in the first plane area PA1 and a plurality of second type pixels PX2 may be disposed in the ring-shaped curved area CA4.

In the ring-shaped curved area CA4, the second type pixels PX2 including more non-flat portions Cv may be disposed as a distance becomes greater from the first plane area PA1 in a first direction (x) and a second direction (y). In an exemplary embodiment, as shown in FIG. 17, a first pixel PX2*a* among the second type pixels PX2 may be disposed at a location that is close to the first plane area PA1, a third pixel PX2*c* among the second type pixels PX2 may be disposed at a location away from the first plane area PA1, and a second pixel PX2*b* may be disposed between the first pixel PX2*a* and the third pixel PX2*c*, for example.

Except for such a difference, features of the exemplary embodiment shown in FIGS. 1 to 9 may be applied to the exemplary embodiment of FIGS. 16 and 17, and therefore a duplicated description between the exemplary embodiments will be omitted.

Figure 18:
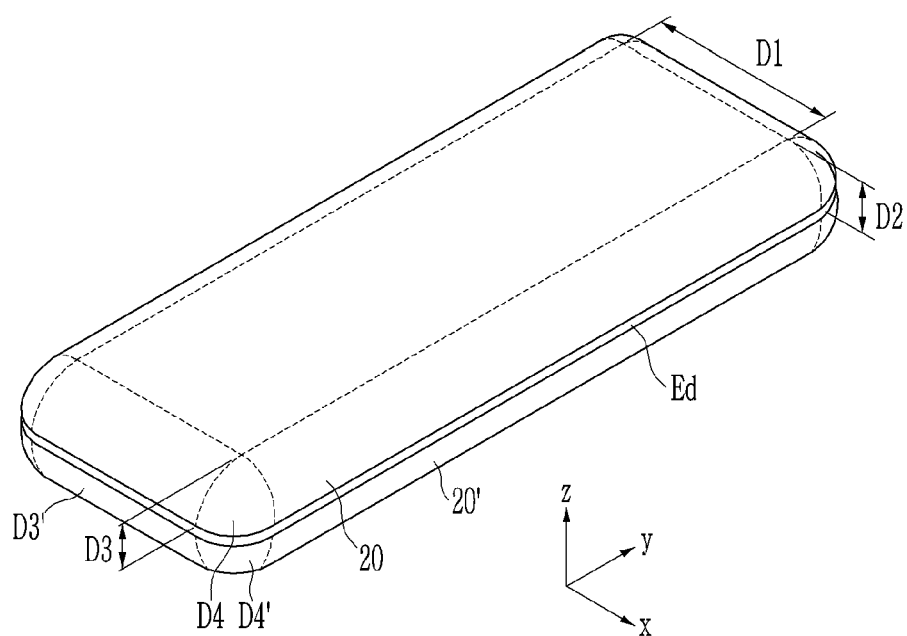
FIGS. 18 and 19 show another exemplary embodiment of display devices according to the invention.
Figure 19:
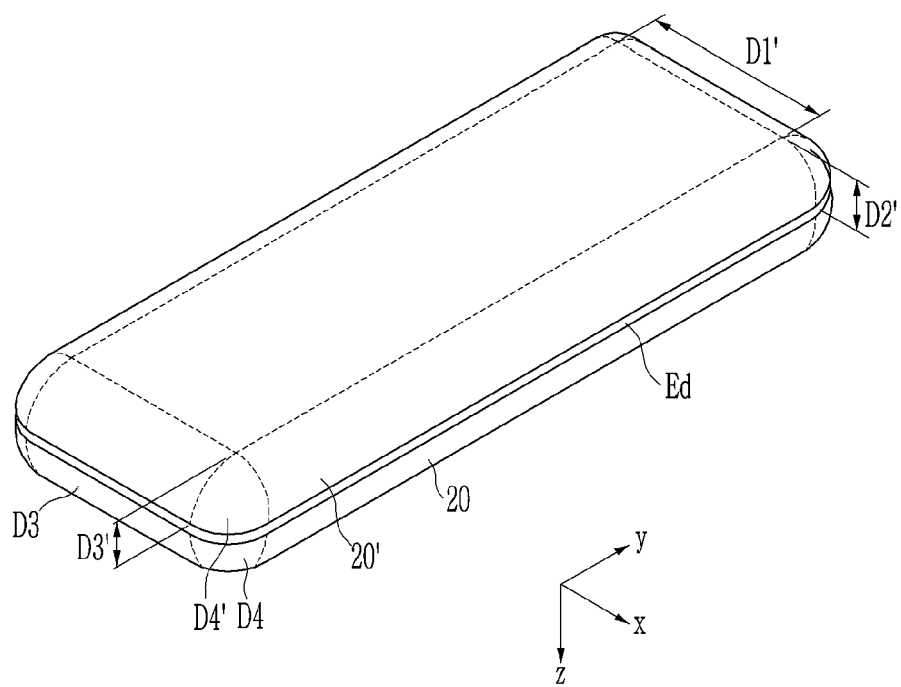

Hereinafter, a display device according to still another exemplary embodiment will be described with reference to FIGS. 18 to 21. FIGS. 18 to 21 show a dual-type display device where an image may be displayed on opposite sides (i.e., a front side and a rear side), and FIG. 18 shows the front side of the display device while FIG. 19 shows the rear side of the display device. Differences will be mainly described with reference to FIGS. 1 to 9 and 12 to 15 described above.

Figure 20:
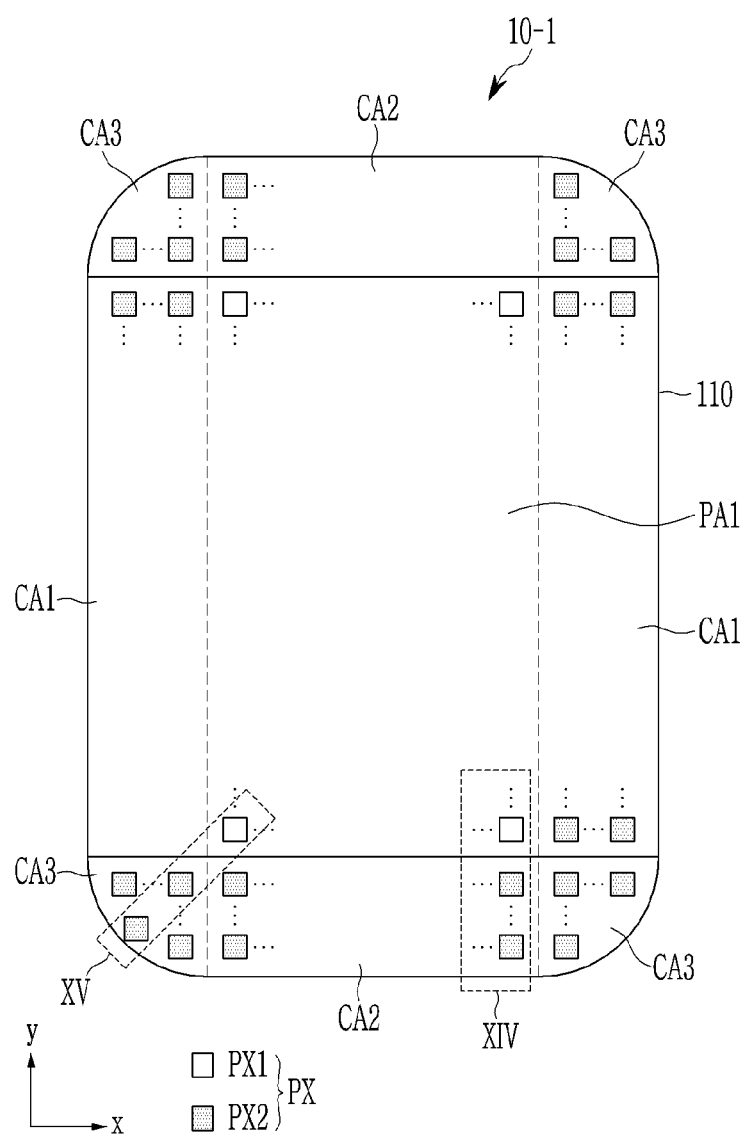
FIGS. 20 and 21 show display panels respectively included in the display devices of FIGS. 18 and 19.
Figure 21:
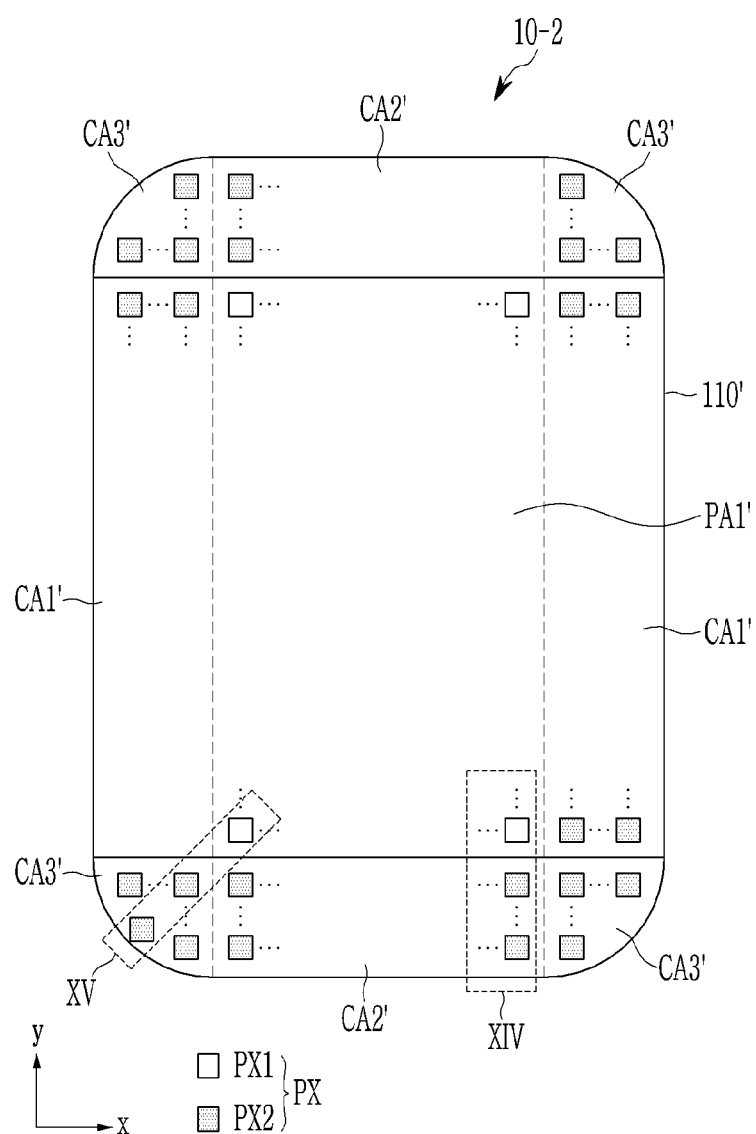

FIGS. 18 and 19 show display devices according to another exemplary embodiment of the invention. FIGS. 20 and 21 show display panels respectively included in the display devices of FIGS. 18 and 19.

Referring to FIGS. 18 to 21, a display device includes a first display panel 10-1 displaying a first image, a second display panel 10-2 displaying a second image, a cover window 20 that protects the first display panel 10-1, and a rear cover window 20′ that protects the second display panel 10-2. The first image may be an image displayed on the front side of the display device, and the second image may be an image displayed on the rear side of the display device. The first image and the second image may be the same image or different images.

A rear side of the cover window 20 and a rear side of the cover window 20′ face each other, and the first display panel 10-1 and the second display panel 10-2 may be disposed between the rear side of the cover window 20 and the rear side of the cover window 20′. The first display panel 10-1 may be bonded to the rear side of the cover window 20, and the second display panel 10-2 may be bonded to the rear side of the rear cover window 20'.

An edge portion Ed may be disposed between an edge of the cover window 20 and an edge of the rear cover window 20'. The edge portion Ed may serve to bond the cover window 20 and the rear cover window 20' to each other, and provide a space for a circuit board or a battery inside the display device. Depending on exemplary embodiments, the edge portion Ed may be omitted, and the edge of the cover window 20 and the edge of the rear cover window 20' may be directly bonded to each other.

The cover window 20 includes a first plane portion D1, first side portions D2 at opposite ends of the first plane portion D1 in a first direction (x), second side portions D3 at opposite sides of the first plane portion D1 in a second direction (y), and third side portions D4 disposed between the first side portions D2 and the second side portions D3. The first side portions D2 may form curved sides of which axes are in the second direction (y), the second side portions may form curved sides of which axes are in the first direction (x), and the third side portions D4 may form curved sides that connect the first side portions D2 and the second side portions D3 each other. The third side portions D4 may form sphere-shaped curved sides with respect to a plurality of axes between the first direction (x) and the second direction (y).

The first plane portion D1 and the first to third side portions D2, D3, and D4 of the cover window 20 may correspond to an area where a main image of the display panel 10-1 is displayed. In an alternative exemplary embodiment, at least one of the first to third side portions D2, D3, and D4 of the cover window 20 may correspond to an area where a side auxiliary image of the display panel 10-1 is displayed. That is, the display panel 10-1 may display a first main image on the area corresponding to the first plane portion D1 and the first to third side portions D2, D3, and D4, or may display a second side auxiliary image on the area corresponding to at least one of the first to third side portions D2, D3, and D4 of the cover window 20.

The rear cover window 20' includes a first rear plane portion D1', first rear side portions D2' at opposite sides of the first rear plane portion D1' in the first direction (x), second rear side portions D3' at opposite sides of the first rear plane portion D1' in the second direction (y), and third rear side portions D4' disposed between the first rear side portions D2' and the second rear side portions D3'. The first rear side portions D2' may form curved sides of which axes are in the second direction (y), the second rear side portions D3' may form curved sides of which axes are in the first direction (x), and the third rear side portions D4' may form curved sides that connect the first rear side portions D2' and the second rear side portions D3' with each other. The third rear side portions D4' may form sphere-shaped curved sides with respect to a plurality of axes between the first direction (x) and the second direction (y).

The first rear plane portion D1' and the first to third rear side portions D2', D3', and D4' of the rear cover window 20' may correspond to an area where a second main image of the second display panel 10-2 is displayed. In an alternative exemplary embodiment, at least one of the first to third rear side portions D2', D3', and D4' of the rear cover window 20' may correspond to an area where a second side auxiliary image of the second display panel 10-2 is displayed. That is, the second display panel 10-2 may display the second main image on the area corresponding to the first rear plane portion D1' and the first to third rear side portions D2', D3', and D4' of the rear cover window 20', or may display the second side auxiliary image on the area corresponding to at least one of the first to third rear side portions D2', D3', and D4' of the rear cover window 20'.

FIG. 20 shows the first display panel 10-1 bonded to the cover window 20, and the first display panel 10-1 includes a substrate 110 and a plurality of pixels PX arranged on the substrate 110. The substrate 110 may include a first plane area PA1 corresponding to the first plane portion D1, first curved areas CA1 corresponding to the first side portions D2 of the cover window 20, second curved areas CA2 corresponding to the second side portions D3 of the cover window 20, and third curved areas CA3 corresponding to the third side portions D4 of the cover window 20. As the first display panel 10-1 is bonded to the cover window 20, the first curved areas CA1, the second curved areas CA2, and the third curved areas CA3 may form curved sides. The third curved areas CA3 are disposed between the first curved areas CA1 and the second curved areas CA2 to connect the first curved areas CA1 and the second curved areas CA2 with each other. The plurality of pixels PX include a plurality of first type pixels PX1 disposed in the first plane area PA1, and a plurality of second type pixels PX2 disposed in the first to third curved areas CA1, CA2, and CA3. However, depending on exemplary embodiments, the second type pixels PX2 may not be disposed in at least one of the first to third curved areas CA1, CA2, and CA3, and the first type pixels PX1 may be disposed therein.

FIG. 21 shows the second display panel 10-2 bonded to the rear cover window 20', and the second display panel 10-2 includes a rear substrate 110' and a plurality of pixels PX arranged on the rear substrate 110'. The rear substrate 110' may include a first rear plane area PA1' corresponding to the first rear plane portion D1', first rear curved areas CA1' corresponding to the first rear side portions D2' of the rear cover window 20', second rear curved areas CA2' corresponding to the second rear side portions D3' of the rear cover window 20', and third rear curved areas CA3' corresponding to the third rear side portions D4' of the cover window 20'. As the second display panel 10-2 is bonded to the rear cover window 20', the first rear curved areas CA1', the second rear curved areas CA2', and the third rear curved areas CA3' may form curved sides. The third rear curved areas CA3' are disposed between the first rear curved areas CA1' and the second rear curved areas CA2' to connect the first rear curved areas CA1' and the second rear curved areas CA2' with each other. The plurality of pixels PX include a plurality of first type pixels PX1 disposed in the first rear plane area PA1', and a plurality of second type pixels PX2 disposed in the first to third rear curved areas CA1', CA2', and CA3'. However, depending on exemplary embodiments, the second type pixels PX2 may not be disposed in at least one of the first to third rear curved areas CA1', CA2', and CA3', and the first type pixels PX1 may be disposed therein.

The second curved areas CA2 of FIG. 20 and the second rear curved areas CA2' of FIG. 21 may be respectively divided into first to third sub-curved areas CA2a, CA2b, and CA2c as described above with reference to FIG. 14, and first pixels PX2a among the second type pixels PX2 may be disposed in the first sub-curved area CA2a, second pixels PX2b among the second type pixels PX2 may be disposed in the second sub-curved area CA2b of the second curved area CA2, and third pixels PX2c among the second type pixels PX2 may be disposed in the third sub-curved area CA2c of the second curved area CA2.

In the third curved areas CA3 of FIG. 20 and the third rear curved areas CA3' of FIG. 21, as previous described with reference to FIG. 15, the second type pixels PX2 including more non-flat portions Cv may be disposed as a distance becomes away from the first plane area PA1 or the first rear plane area PA1' in the first direction (x) and the second direction (y).

Except for such a difference, features of the exemplary embodiment shown in FIGS. 1 to 9 and 12 to 15 may be applied to the exemplary embodiment of FIGS. 18 to 21, and therefore a duplicated description between the exemplary embodiments will be omitted.

Figures 22A, 22B:
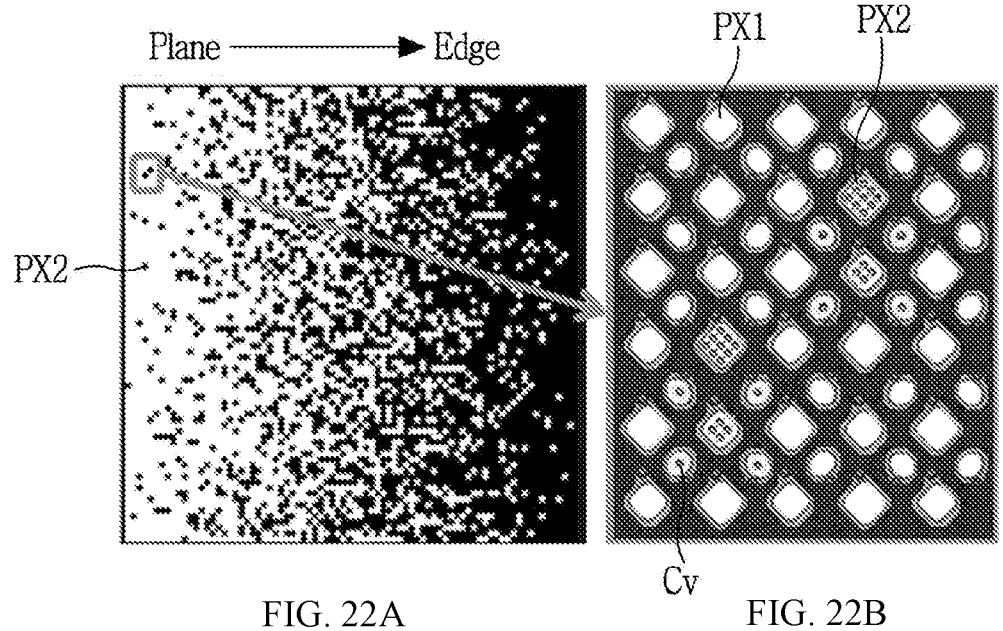
FIGS. 22(A) and 22(B) show a distribution of second type pixels in a curved area of an actual display device.

FIGS. 22(A) and 22(B) show a distribution of second type pixels in a curved area of an actual display device.

FIG. 22 (A) shows a distribution of the second type pixels PX2 disposed in a random curved area in the display device, and FIG. 22(B) is an enlarged view of a portion where the second type pixels PX2 are arranged. In FIG. 22(A), an area where the second type pixels PX2 are not disposed may be an area where the first type pixels PX1 are disposed.

Referring to FIGS. 22(A) and 22(B), a distribution of the second type pixels PX2 including non-flat portions Cv is irregularly gradually increased while becoming closer to an edge of the display panel from a plane area. That is, the first type pixels PX1 and the second type pixels PX2 may be arranged together in the curved area, and the distribution of the first type pixels PX1 is gradually decreased and the distribution of the second type pixels PX2 is gradually increased while moving toward the edge of the display panel from the plane area. An arrangement between the first type pixels PX1 and the second type pixels PX2 that are adjacent to each other may be irregular.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. It will be understood by those skilled in the art that various changes in form and detail may be made without departing from the scope of the invention. Accordingly, the true scope of the invention should be determined by the technical idea of the appended claims.

What is claimed is:

1. A display device comprising:
a substrate which includes a first plane area and first curved areas forming curved sides;
a plurality of first type pixels disposed in the first plane area, each of the plurality of first type pixels comprising a first light emitting diode provided in parallel with one side of the substrate; and
a plurality of second type pixels disposed in the first curved areas, and each comprising a second light emitting diode which includes at least one non-flat portion forming a non-flat side which is not parallel with one side of the substrate,
wherein a number of non-flat portions included in a second type pixel of the second type pixels is increased as a distance becomes greater from the first plane area.

2. The display device of claim 1, wherein a distribution of the plurality of second type pixels is gradually increased as a distance becomes greater from the first plane area.

3. The display device of claim 1, wherein the first curved areas comprise first sub-curved areas disposed closest to the first plane area and second sub-curved areas disposed farther away from the first plane area than the first sub-curved areas,
the plurality of second type pixels comprises first pixels, each including a predetermined number of non-flat portions and second pixels, each including more non-flat portions than those of the first pixel, and the first pixel is disposed in the first sub-curved area and the second pixel is disposed in the second sub-curved area.

4. The display device of claim 3, wherein the first pixel and the second pixel respectively comprise red pixels, green pixels, and blue pixels, and
a number of non-flat portions included in the red pixel is different from a number of non-flat portions included in the green pixel or the blue pixel in at least one of the first sub-curved area and the second sub-curved area.

5. The display device of claim 1, wherein the first curved areas are disposed at opposite ends of the first plane area in a first direction.

6. The display device of claim 5, wherein the substrate further comprises second curved areas disposed at opposite ends of the first plane area in a second direction and forming curved sides, and third curved areas connecting the first curved areas and the second curved areas with each other, and
pixels having the same type of the plurality of second type pixels are disposed in at least one of the second curved area and the third curved area.

7. A display device comprising:
a first plane area viewed as a plane in a plan view;
first curved areas viewed at a side viewing angle tilted at a predetermined angle with reference to the first plane area;
a plurality of first type pixels disposed in the first plane area, each of the plurality of first type pixels comprising a first light emitting diode provided parallel with the plane;
a plurality of second type pixels disposed in the first curved areas, each of the plurality of second type pixels comprising a second light emitting diode including at least one non-flat portion forming a non-flat side which is not parallel with the plane.

8. The display device of claim 7, wherein a distribution of the plurality of second type pixels is gradually increased as the side viewing angle is increased.

9. The display device of claim 7, wherein a number of non-flat portions included in the second type pixel is increased as the side viewing angle is increased.

10. The display device of claim 9, wherein the first curved areas comprise first sub-curved areas viewed at a side viewing angle tilted to a first angle range with reference to the first plane area and second sub-curved areas viewed at a side viewing angle tilted to a second angle range which is greater than the first angle range with reference to the first plane area, and
a number of non-flat portions included in the second type pixels disposed in the second sub-curved areas is greater than a number of non-flat portions included in the second type pixels disposed in the first sub-curved areas.

11. The display device of claim 10, wherein the plurality of second type pixels comprises red pixels, green pixels, and blue pixels, and a number of non-flat portions included in the red pixel in the first sub-curved areas is different from a number of non-flat portions included in the green pixel or the blue pixel in the first sub-curved areas.

12. The display device of claim 11, wherein a number of non-flat portions included in the red pixel in the second sub-curved areas is different from a number of non-flat portions included in the green pixel or the blue pixel in the second sub-curved areas.

* * * * *